US012429516B2

United States Patent
Neogi et al.

(10) Patent No.: US 12,429,516 B2
(45) Date of Patent: Sep. 30, 2025

(54) PREDICTION OF ELECTRONIC TRANSPORT WITH PHYSICS-AWARE MACHINE LEARNING

(71) Applicant: THE REGENTS OF THE UNIVERSITY OF COLORADO, Denver, CO (US)

(72) Inventors: Sanghamitra Neogi, Boulder, CO (US); Artem Konstantinovich Pimachev, Boulder, CO (US)

(73) Assignee: The Regents of the University of Colorado, a Body Corporate, Denver, CO (US)

( * ) Notice: Subject to any disclaimer, the term of this patent is extended or adjusted under 35 U.S.C. 154(b) by 366 days.

(21) Appl. No.: 17/930,619

(22) Filed: Sep. 8, 2022

(65) Prior Publication Data

US 2023/0088979 A1    Mar. 23, 2023

Related U.S. Application Data

(60) Provisional application No. 63/241,871, filed on Sep. 8, 2021.

(51) Int. Cl.
*G01R 31/26*    (2020.01)
*G06N 20/00*    (2019.01)

(52) U.S. Cl.
CPC ......... *G01R 31/2648* (2013.01); *G06N 20/00* (2019.01)

(58) Field of Classification Search
None
See application file for complete search history.

(56) References Cited

FOREIGN PATENT DOCUMENTS

WO    WO-2020076181 A1 *  4/2020  ............. G05B 17/02

OTHER PUBLICATIONS

Popescu, et al., Extracting E versus K Effective Band Structure from Supercell Calculations on Alloys and Impurities, American Physical Society, Physical Review B 85, 085201 (2012).
Ward, et al., Including Crystal Structure Attributed in Machine Learning Models of Formation Energies via Voronoi Tessellations, American Physical Society, Physical Review B 96, 024104 (2017).
Lee, et al., Unfolding Method for the First-Principles LCAO Electronic Structure Calculations, arXiv:1211.4690v3 [cond-mat-mtrl-sci] May 17, 2013.
Boykin, et al.,. Approximate Bandstructures of Semiconductor Alloys from Tight-Binding Supercell Calculations, Institute of Physics Publishing, Journal of Physics: Condensed Matter 19 (2007).

* cited by examiner

*Primary Examiner* — Matthew G Marini
(74) *Attorney, Agent, or Firm* — Cozen O'Connor

(57) ABSTRACT

A method for determining electronic band structure includes partitioning, based on a location of each of a plurality of atoms forming a crystalline structure, a volume of the crystalline structure to obtain Voronoi tessellations. The method also includes constructing, based on the Voronoi tessellations, a plurality of crystal graphs and deriving, based on the plurality of crystal graphs, one or more local structural features of the crystalline structure. The method also includes feeding, into a trained machine-learning model, the one or more local structural features, one or more global structural features of the crystalline structure, and one or more species-based features of the crystalline structure. The trained machine-learning model, in response to said feeding, returns a plurality of energy values that sample a Brillouin zone of the crystalline structure.

16 Claims, 21 Drawing Sheets

PREDICTION OF ELECTRONIC TRANSPORT WITH PHYSICS-AWARE MACHINE LEARNING

RELATED APPLICATIONS

This application claims priority to U.S. Provisional Patent Application No. 63/241,871, titled "Systems and methods to predict performance of microchips and other electronic devices" and filed on Sep. 8, 2021, which is incorporated herein by reference in its entirety.

STATEMENT REGARDING FEDERALLY SPONSORED RESEARCH OR DEVELOPMENT

This invention was made with government support under grant number OAC1940231, awarded by the National Science Foundation, and grant number HR0011-16-2-0043, awarded by DOD/DARPA. The government has certain rights in the invention.

BACKGROUND

Semiconductor heterostructures have brought about tremendous changes in our everyday lives in the form of telecommunication systems utilizing double-heterostructure lasers, heterostructure light-emitting diodes, or high-electron-mobility transistors used in high-frequency devices, including satellite television systems [1]. Heterostructures comprising silicon (Si) and germanium (Ge) in particular, have emerged as key materials in numerous electronic [2-5], optoelectronic [6, 7], and thermoelectric devices [8, 9], as well as being a promising host to spin qubits [10]. Recent developments of nanofabrication and characterization techniques achieved great control over the growth of Si/Ge heterostructures [11-15]. Nevertheless, fabrication of heterostructures is strongly affected by strain relaxation in component layers [5], and the resulting electronic properties show high variability due to inconsistent fabrication dependent structural parameters [9, 16, 17]. A few theoretical studies discussed the effect of non-idealities on electronic properties of heterostructures [18, 19], however, these studies were parametric in nature. It is essential to acquire a comprehensive understanding of the complex relationship between growth dependent parameters and electronic properties, to attain targeted semiconductor heterostructure design with reliable electronic performance. Ab initio techniques enable prediction of materials properties with minimal experimental input; however, they often come at a large computational cost. In particular, the calculations of electronic transport coefficients, such as thermopower or conductivity, require large number of individual energy calculations and computational costs can accrue quickly. It remains a challenge to model electronic transport coefficients of technologically relevant heterostructures incorporating full structural complexity, representing the vast fabrication dependent structural parameter space.

SUMMARY

The present embodiments feature a novel framework that combines first-principles physics models with artificial intelligence techniques to predict performance efficiency of existing electronic devices under operating conditions. The present embodiments also inform design of future devices with improved performance. The use of machine learning (ML) techniques helps avoid computationally expensive analysis and accelerate the pace. Inserting physics awareness into the ML models allows complex physical phenomena to be captured and increases the robustness of the prediction.

In a first aspect, a method for determining electronic band structure includes: partitioning, based on a location of each of a plurality of atoms forming a crystalline structure, a volume of the crystalline structure to obtain Voronoi tessellations; constructing, based on the Voronoi tessellations, a plurality of crystal graphs; deriving, based on the plurality of crystal graphs, one or more local structural features of the crystalline structure; and feeding into a trained machine-learning model (i) the one or more local structural features, (ii) one or more global structural features of the crystalline structure, and (iii) one or more species-based features of the crystalline structure. The trained machine-learning model, in response to said feeding, returns a plurality of energy values that sample a Brillouin zone of the crystalline structure.

In a second aspect, a system for determining electronic band structure includes a processor, a memory in electronic communication with the processor, a trained machine-learning model stored in the memory, and machine-readable instructions that are stored in the memory. The machine-readable instructions, when executed by the processor, control the system to: (i) partition, based on a location of each of a plurality of atoms forming a crystalline structure, a volume of the crystalline structure to obtain Voronoi tessellations, (ii) construct, based on the Voronoi tessellations, a plurality of crystal graphs, (iii) derive, based on the plurality of crystal graphs, one or more local structural features of the crystalline structure, and (iv) feed, into a trained machine-learning model, the one or more local structural features, one or more global structural features of the crystalline structure, and one or more species-based features of the crystalline structure. The trained machine-learning model, in response to being fed, returns a plurality of energy values that sample a Brillouin zone of the crystalline structure.

BRIEF DESCRIPTION OF THE FIGURES

FIG. 2A shows an example crystal graph, G, of a typical Si/Ge configuration.

FIG. 2B shows Voronoi tessellations of a model $Si_4Ge_4$ superlattice.

FIG. 11 shows calculations of effective weights to determine the species-aware and directionally-biased order parameters of the crystal graph of FIG. 10A.

DETAILED DESCRIPTION

An electronic-transport-informatics (ETI) framework based on first principles is trained on electronic structure properties of small systems and predicts transport coefficients, namely thermopowers of experimental semiconductor heterostructures. The framework is built on the hypothesis that functional relationships between local atomic configurations, CN(r), and their contributions to global energy states, E, are preserved when the configurations are part of a nanostructure with different composition and/or dimensions. The rationale for the hypothesis is rooted in the fundamental insight that material's physical properties, ranging from mechanical to electronic, are intimately tied to the underlying symmetry of the crystal structure [33]. Using this hypothesis, the relationship between the local atomic configuration and the global energy state, $f(CN(r),E)$, may be established in few-atom fragment units with varied atomic environments. The relationship may further be used to predict the progression of $f(CN(r), Ê)$ in larger nanostructures comprising similar local environments, CN(r).

We implement this hypothesis to extrapolate the insight acquired from small ab-initio models to predict local $f(CN(r), Ê)$'s in experimental semiconductor heterostructures. The global energy states of the heterostructure are estimated with known CN(r)'s by assimilating the predicted $f(CN(r), Ê)$'s. The global energy states are then used to predict Seebeck coefficients (S), or thermopowers, that are validated against numerical results obtained with first-principles methods (i.e., using density functional theory), or experimental data. The hypothesis may also similarly be applied to obtain other electronic transport coefficients. Our ETI framework thus establishes that ML can be exploited to address the gap between ideal ab-initio models and systems realized with nanofabrication techniques.

To accomplish this, an ML model is developed to extract the structure-electronic property relationships from data generated with density functional theory (DFT) calculations. We predict atomically resolved contributions to the effective band structures or the spectral functions of heterostructures. Examples are shown below that validate the forward ML model predicting such contributions in complex silicon (Si)-germanium (Ge) heterostructures, such as $Ge_3Si_3Ge_6Si_9Ge_{15}Si_{24}$, by comparing to data calculated using DFT. Herein, the numbers in heterostructure, such as $Ge_3Si_3Ge_6Si_9Ge_{15}Si_{24}$, refer to numbers of monolayers.

ETI Framework

1. Machine-Learning Model

Figure 1:
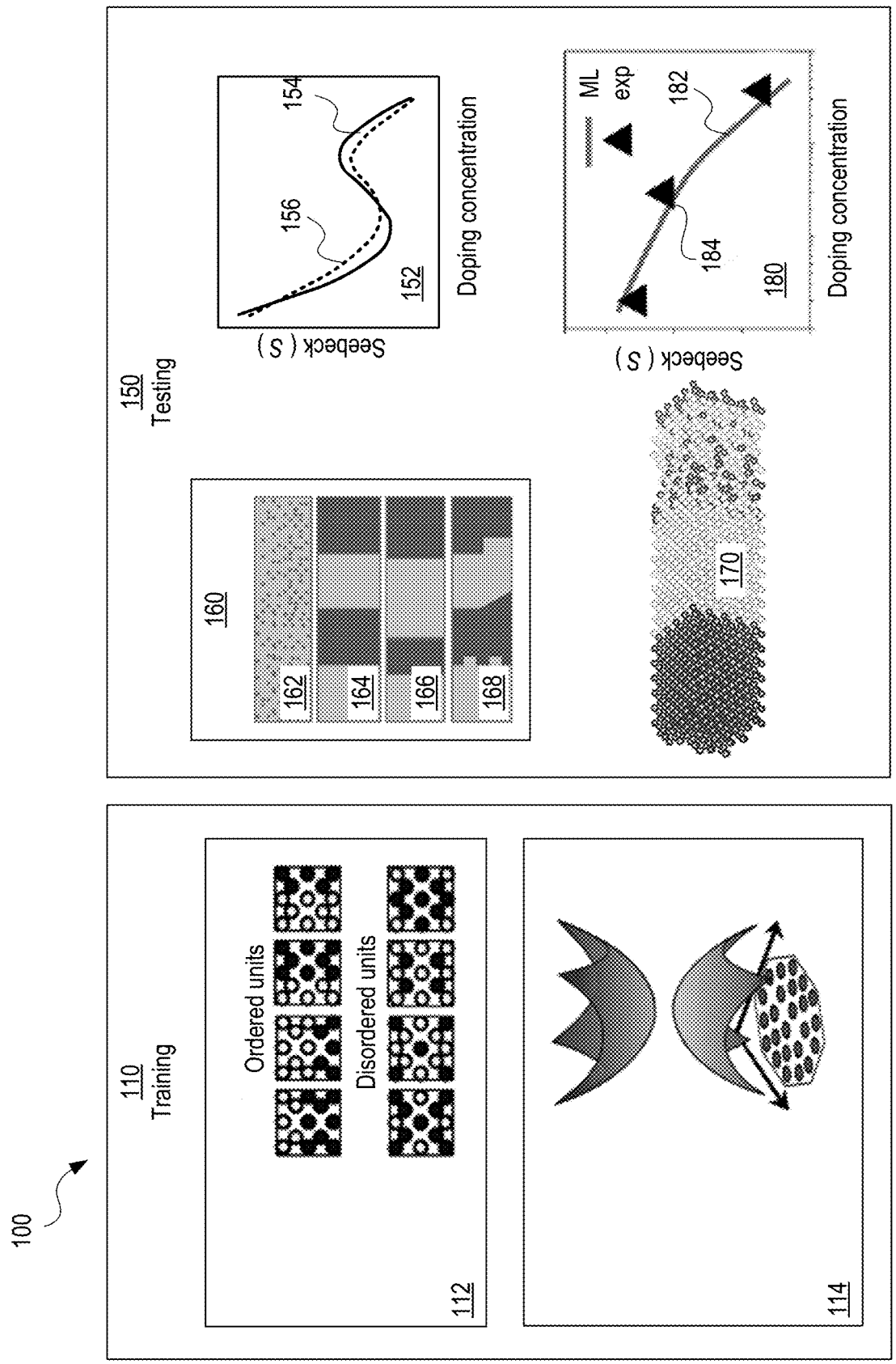
FIG. 1 shows a schematic of a forward machine learning model in an electronic-transport-informatics framework, in an embodiment.

FIG. 1 shows a schematic of an ML model 100 of an ETI framework. The ML model 100 provides first-principles prediction of thermopowers of experimental Si/Ge heterostructures. The forward ML model 100 includes an ML training 110 and an ML testing 150. The ML training 110 includes training the ML algorithm based on the relationship between local atomic configuration 112, CN(r), and corresponding electronic bands 114, E. The local atomic configuration 112 includes ordered and disordered 16-atom fragment units of varying compositions. While the local atomic configuration 112 shows 16-atom fragment units in the figure, fragment units may have different number of atoms.

For training the ML algorithms, features describing local atomic configurations, CN(r), of the fragment units are used along with electronic bands 114, E(k,b), calculated using DFT, where b is the band index and k-points sample Brillouin zones of the units. The ML strategy to establish the relationship, $f(CN(r),E(k,b))$, may include neural networks (NN) and random forests (RF). An output of the trained ML model includes a predicted electronic bands, $Ê(k,b)$, for given inputs CN(r).

For testing the ML algorithms, an input 160 that corresponds to larger heterostructures is used. For example, the input 160 may include local atomic configurations, CN(r), for random alloys 162, superlattices 164, random multilayers 166, and non-ideal heterogeneous structures 168. The predicted electronic bands $Ê(k,b)$ may then be compared with DFT-calculated effective band structures. For example, a plot 152 compares Seebeck coefficient (S) to direct results of DFT. The Seebeck coefficient, or thermopower, is calculated from the predicted electronic bands, $Ê(k,b)$, using semi-classical Boltzmann transport equation (BTE). The plot 152 shows a calculated trace 154 of S using the predicted electronic bands and a trace 156 from direct DFT results.

An experimental validation of the ML model 100 was also performed. A fabricated heterostructure having an atomic configuration 170 was used as an input to the ML algorithms. The Seebeck coefficient was then calculated from the predicted electronic bands, $\hat{E}(k,b)$ using BTE and compared with measured data in a plot 180. The plot 180 shows a trace 182 that is calculated from $\hat{E}(k,b)$ and experimentally measured points 184. Consequently, the ML training establishes the relationship, $f(CN(r), \hat{E})$ and extends the relationship to larger heterostructures. The steps of the ML model 100 include (1) creating a data resource to harvest $f(CN(r) E)$, (2) formulating a representation that uniquely describes $CN(r)$, which leads to characterizing $f(CN(r),E)$, in a fragment unit or target heterostructure, (3) choosing ML algorithms to discover correlations in training data, and (4) testing ML predictions for other structures against known data. These steps are described in the following sections.

1.1 Creating a Data Resource

Materials property databases, such as Material Project [28] and NOMAD Repository & Archive [29], may be used to collect training data. However, the electronic structure property data of only limited number of Si/Ge structures are available. Additionally, the available data do not provide necessary sampling of the structure Brillouin zones (BZs) to converge electronic transport coefficients, requiring us to create our own data resource. To minimize data generation efforts, we limit the number of electronic property calculations, and instead, mine the large amount of information generated in individual calculations. The available information greatly facilitates the development of the ETI framework, and based on that insight, we follow two strategies: (i) carefully choosing fragment units used for training, and (ii) utilizing atomistic information generated from individual DFT calculations of the fragment units as training data.

The first strategy is implemented by choosing Si/Ge systems with variety of strain environments as training fragments. In heterostructures, strain is generated due to various mechanisms including structural (lattice mismatch, presence of defects), thermal expansion or chemical (phase transition) changes. Naturally, the strain environment is variable, and the resulting electronic properties are unpredictable, making the problem ideal for the application of an ML technique. Si/Ge system is chosen because the bands of Si/Ge heterostructures are significantly affected by strain [34-37]. Application of strain leads to more than an order of magnitude variation in electronic properties over the non-strained materials [38-40]. The local atomic configurations 112 of FIG. 1 show two categories of the fragment training systems: ordered and disordered units. In the example shown, the 16-atom units include ordered layered Si/Ge superlattices (SLs) and disordered Si—Ge "alloys". While the small size of the model units along with the imposed periodic boundary conditions may not reflect true randomized alloy configurations, the models allow us to explore $f(CN(r),E)$ in these binary systems as a function of variable atomic environments. Following the success shown by ML-based approaches using DFT generated data, DFT is used to generate training data. The DFT computed electronic structure properties and energy bands of the model units serve as training data and benchmark for cross-validation tests.

1.2 Formulating a Representation

Identification of a minimal set of features is crucial to formulate relevant structure-property relationships [22, 42, 43]. The features in this model describe sub-Angstrom-scale structural details because of the reasons that include: (i) electronic transport in a heterostructure being highly sensitive to local structural environment, and (ii) success of ETI being based on the hypothesis that $f(CN(r),E)$ is preserved across structures hosting similar environment and determines the electronic transport properties. Thus, it is essential that the correlations, $f(CN(r),E)$, are built upon fine details of $CN(r)$, to ensure the transferability of the framework across structures. However, $f(CN(r),E)$ may be multivariate and highly nonlinear. Hence, a feature subset that is strongly correlated with the electronic transport properties needs to be identified from a large structural parameter space. A diverse set of elemental properties are used as features in ML studies [42]. Advantageously, since the heterostructures in the examples in this disclosure are binary, the elemental-property-based features differ only slightly across the various configurations and are not expected to provide unique information to develop $f(CN(r),E)$. The complexity may then be reduced to one elemental-property-based feature, computed from the electronegativity difference of the species (e.g., between Si and Ge). Instead, we include multiple global and local structural features that are directly affected by strain. Global features include atomic composition of the systems, Ge or "doping" concentration shown in plots 152 and 180 for example, and lattice constants (a, b, c). Herein, the term species refers to species that include atomic species but may also include porous materials including voids without departing from the scope of this disclosure. Hence, species may refer to presence or absence of material. For example, a void may be present in a structure.

To determine the relevant local features describing $CN(r)$, we express the structures as crystal graphs that encode both atomic information and bonding environments [44-46]. Crystal graph-based ML models have shown great success for first-principles materials property prediction [42, 44-46]. FIG. 2A shows an example crystal graph 201, G, of a typical Si/Ge configuration. Crystal graph 201 includes atoms that may, for example, be Si 214 and atoms that may be Ge 212. An atom at node X 211 and the neighboring atoms form nodes, and the interatomic distances constitute edges. We identify the neighboring atoms from Voronoi tessellations (VT) of the crystal structure. For example, the crystal graph 201 shows an atom at node X 211 connected to neighboring atoms with G(1) 224, or order=1, and with G(2) 222, or order=2.

Figure 2C:
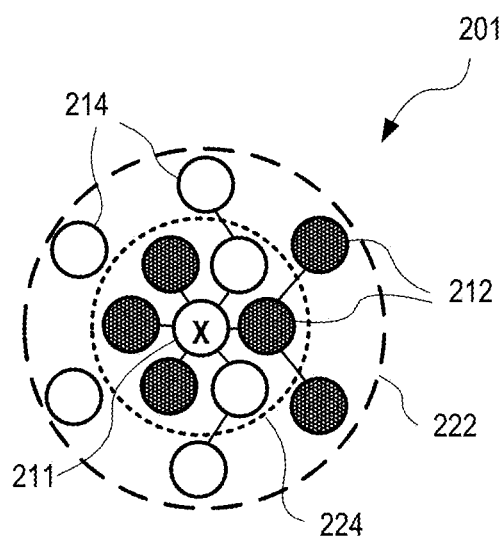
FIG. 2C shows an example Voronoi cell in a representative Si/Ge configuration.
Figure 2C:
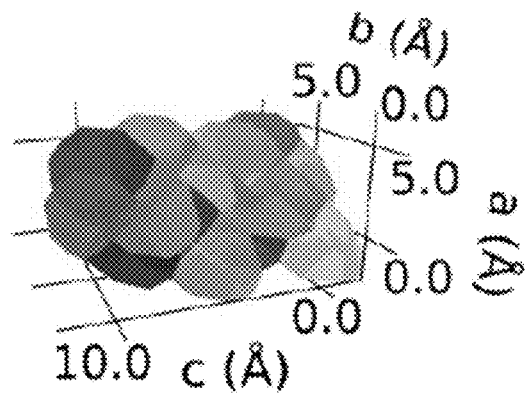
Figure 2C:
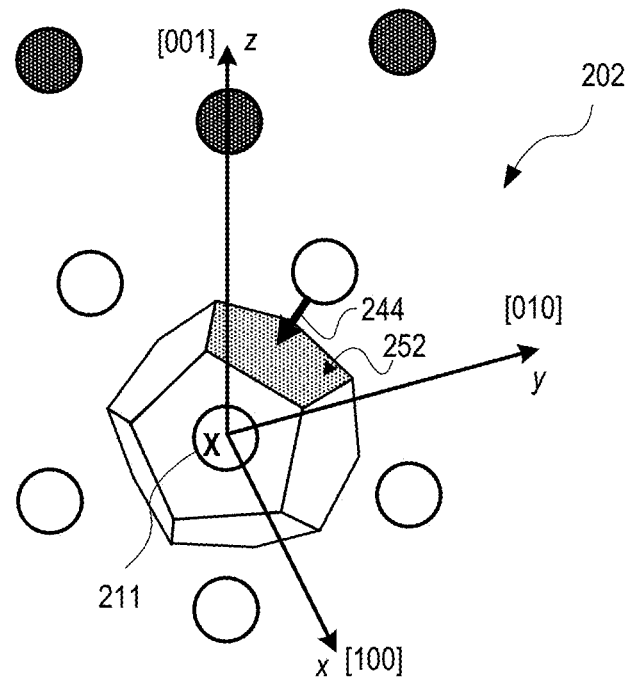

FIG. 2B shows VT of a model $Si_4Ge_4$ SL. The neighbors occupy adjoined cells and share faces in the tessellations. Thus, each face of a Voronoi cell marks a specific nearest neighbor of the selected atom. FIG. 2C shows an example Voronoi cell 202 in a representative Si/Ge configuration. Advantageously, in the VT approach, the tessellations are uniquely defined for a given local environment and are insensitive to global dimensions of the structure. Therefore, VT-derived features enable transferring of $f(CN(r),E)$ across structures of varying dimensions. For example, VT-derived features have facilitated successful ML-based prediction of formation enthalpies [42]. In total, we describe $CN(r)$ of each configuration with 100 features, which are further described below. The relative feature importance data shown in Fig. S7 reflects the strong influence of VT-derived features on the performance of the ETI framework.

In our feature set, the local spatial ordering of atoms is represented by order parameters, $Q_X^{order}$:

$$Q_X^{order} = \sum_{paths} \prod_{\substack{steps\ in \\ G(order)}} \underbrace{\frac{A_n \delta_{nX}}{\sum_a A_a - \sum_b A_b}}_{fractional\ weight}. \quad (1)$$

Figure 2D:
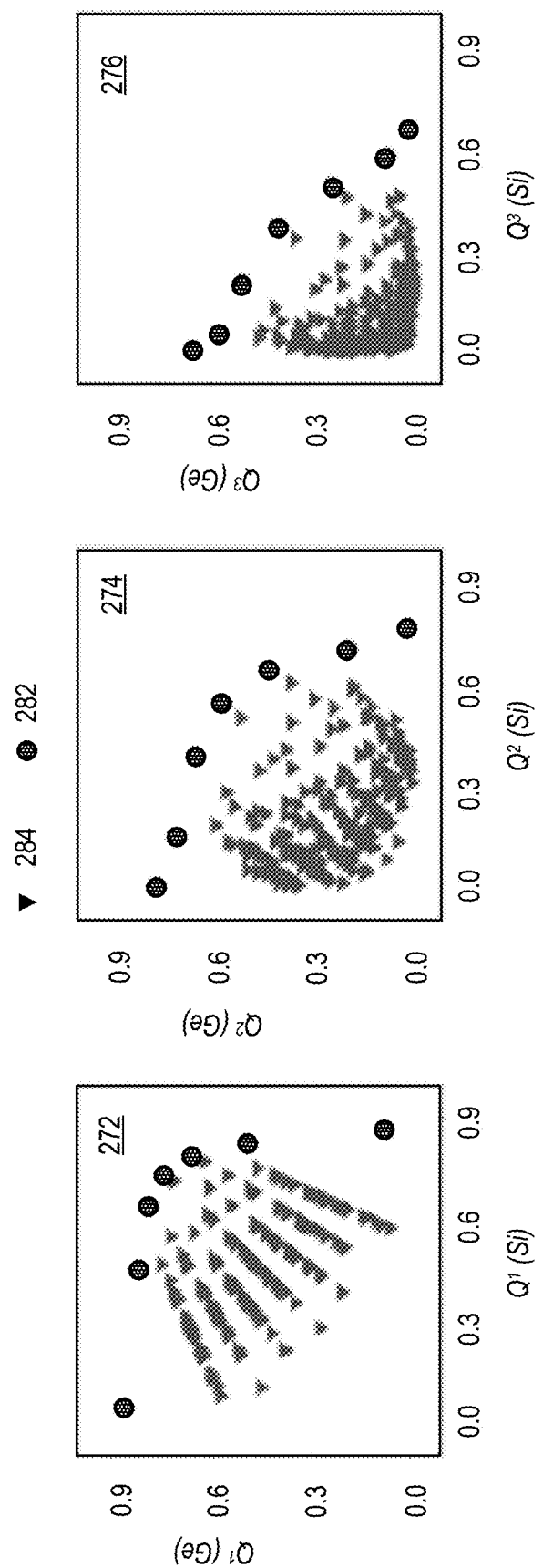
FIG. 2D shows scatter plots illustrating $Q^{order}(Ge)$ in terms of $Q^{order}(Si)$, where order=1, 2, and 3, respectively, for seven ordered fragment units and 350 disordered fragment units.

The paths connect all neighboring atoms up to a specified order in the crystal graph, e.g., G(1) 224, G(2) 222 in FIG. 2A. The order may be limited to 3, G(3), because higher order graphs likely do not significantly impact the predictions; however, the cost to construct them increases proportionally with the volume containing the neighbors. The Kronecker delta function in the numerator of Eqn. 1 further restricts consideration of paths connecting only atoms of same type as X, yielding species aware crystal graphs. For example, the paths connecting the Si 214 or the Ge 212 circles in FIG. 2A assume atom X 211 to be of type Si 214 or Ge 212, respectively. A typical step along a path connecting neighbors to atom X 211 is shown by a directional arrow 244 in FIG. 2C. The step crosses the face 252 of index n and area $A_n$, normal to its direction. The ratio between area, $A_n$, and the sum over all areas the step could possibly cross, $A_a$, that are part of other non-backtracking paths, determines the fractional weight in Eqn. 1. Thus, the fractional weight of each step can be understood as the probability of taking the step. The product of fractional weights of all steps in a path determines the effective weight, the probability of choosing the path. The sum of the effective weights of all possible non-backtracking paths in G(1), G(2) and G(3) results in $Q_X^{order}$ FIG. 2D shows scatter plots 272, 274, and 276 illustrating $Q^{order}(Ge)$ in terms of $Q^{order}(Si)$, where order=1, 2, and 3, respectively, for seven ordered fragment units (SLs) 282 and 350 disordered fragment units (alloys) 284. The scatter plots 272, 274, and 276 illustrate that we can distinguish each Si/Ge configuration by $Q_{Si}^{order}$ and $Q_{Ge}^{order}$. For example, the distinct clusters of data points representing the layered SL 282 and the "alloy" 284 configurations may be recognized in scatter plots 272, 274, and 276. Thus, the order parameters are highly effective in distinguishing configurations with different degrees of structural ordering. In each of scatter plots 272, 274, and 276, higher order parameter values decrease at a fast rate for disordered "alloy" configurations, but only slightly for SLs.

Figure 2E:
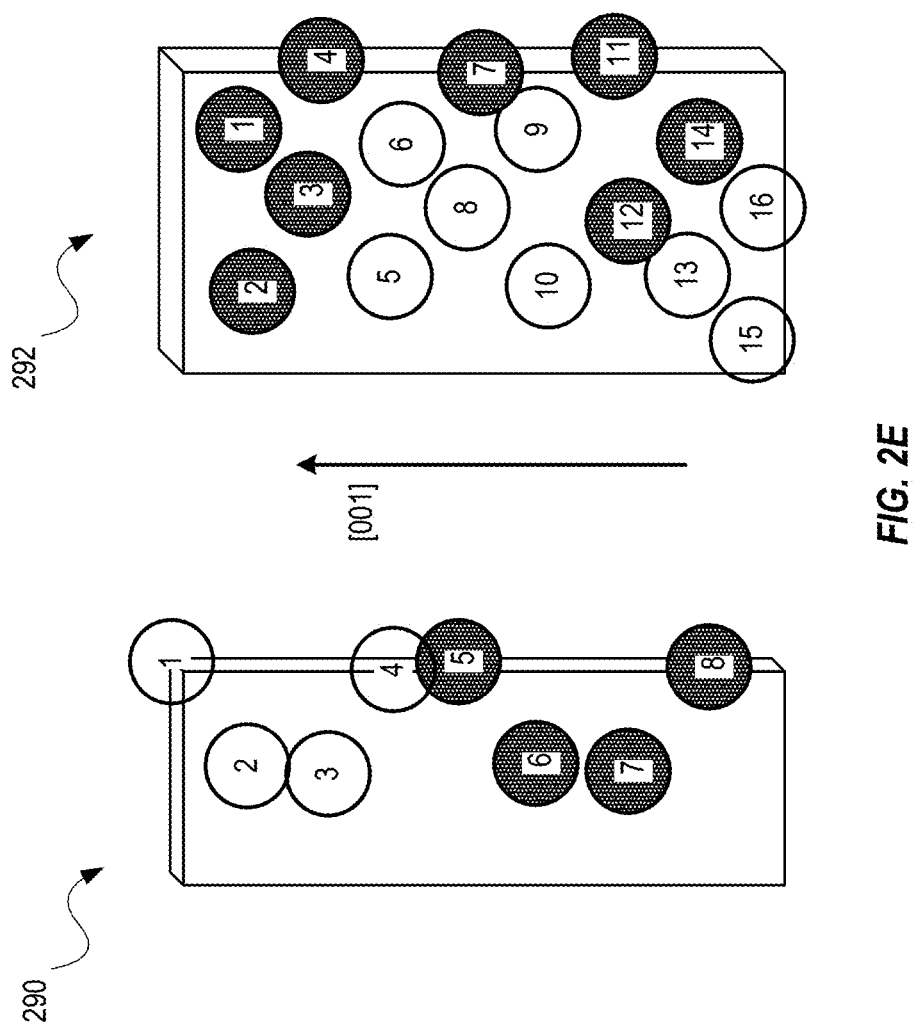
FIG. 2E shows example configurations that illustrate order parameter concept.

To further distinguish the anisotropic bonding environment of a SL compared to a disordered unit, we define directionally-biased order parameters, $Q_X^{\Omega=(x,y,z),order}$. The bias is implemented by calculating the fractional weights using projections of $A_n$ along a chosen direction only. FIG. 2E shows example configurations 290 and 292 that illustrate order parameter concept. The configuration 290 shows order numbers for $Si_4Ge_4$ SL, and the configuration 292 shows the order numbers for SigGeg disordered "alloy". In Table 1 below, we show $Q_X^{\Omega,order}$ of the atoms of the $Si_4Ge_4$ SL configuration 290. As a reference, these order parameters are all equal to 1 for bulk systems. The in-plane order parameters, $Q_X^{x,order}$ and $Q_X^{y,order}$ are equal, due to the rotational symmetry of the configuration around z-axis, aligned along [001]. In comparison, $Q_X^{z,order}$ is lower and decreases faster with the order number, reflecting heterogeneous stacking along z direction. $Q_X^{z,order}$ can be used to identify the different atomic environments along z direction. For example, $Q^{z,1} \sim 0.5$-0.6 represents interface atoms and $Q^{z,1} \sim 0.9$-1.0 indicates inner atoms. The order parameter values are higher for inner atoms and lower for interface atoms. This is due to the presence of greater number of same species neighbors resulting in more paths contributing to order parameters of inner atoms. The order parameters also highlight the reflection symmetry with respect to the x-y plane, yielding identical values for atom pairs such as (1,2)≡(4,3) and (5,6)≡(8,7). In comparison, the order parameters of the $Si_8Ge_8$ random "alloy" configuration 292 do not show any specific pattern and decrease fast with the order number reflecting the disordered atomic arrangement. The order parameter feature $Q_X^{\Omega,order}$ is particularly important since directional ordering controls the atomic orbital contributions to energy bands in Si/Ge heterostructures [35].

TABLE 1

| Atom | # | $Q^{x,1}$ | $Q^{y,1}$ | $Q^{z,1}$ | $Q^{x,2}$ | $Q^{y,2}$ | $Q^{z,2}$ | $Q^{x,3}$ | $Q^{y,3}$ | $Q^{z,3}$ |
|---|---|---|---|---|---|---|---|---|---|---|
| Si | 1 | 0.55 | 0.55 | 0.51 | 0.49 | 0.49 | 0.45 | 0.36 | 0.36 | 0.29 |
| Si | 2 | 0.95 | 0.95 | 0.89 | 0.64 | 0.64 | 0.53 | 0.43 | 0.43 | 0.34 |
| Si | 3 | 0.95 | 0.95 | 0.89 | 0.64 | 0.64 | 0.53 | 0.43 | 0.43 | 0.34 |
| Si | 4 | 0.55 | 0.55 | 0.51 | 0.49 | 0.49 | 0.45 | 0.36 | 0.36 | 0.29 |
| Ge | 5 | 0.53 | 0.53 | 0.49 | 0.47 | 0.47 | 0.46 | 0.37 | 0.37 | 0.30 |
| Ge | 6 | 0.97 | 0.97 | 0.94 | 0.70 | 0.70 | 0.58 | 0.47 | 0.47 | 0.36 |
| Ge | 7 | 0.97 | 0.97 | 0.94 | 0.70 | 0.70 | 0.58 | 0.47 | 0.47 | 0.36 |
| Ge | 8 | 0.53 | 0.53 | 0.49 | 0.47 | 0.47 | 0.46 | 0.37 | 0.37 | 0.30 |

1.3 Choosing ML Algorithm

We use supervised neural network (NN) and random forests (RF) algorithms to learn $f(CN(r),E)$, and compare performance of the two algorithms in predicting $\hat{E}$ for given CN(r). The following paragraphs describe an example use scenario of the ML algorithms.

For NN algorithm, in certain embodiments, our model includes an input layer of 128 nodes, three fully connected hidden layers each with 256 nodes, and an output layer with nodes equal to the number of energy values, $\hat{E}(k,b)$: $k_x \times k_y \times k_z \times b$. We consider six valence and six conduction bands (b), and a 21×21×21 k-point mesh to sample the respective BZ, resulting in 21×21×21×12 E(k,b) values for each training configuration. The model input is determined by number of features considered. Table 2 below summarizes the training sets and test data. The training sets are split into random batches of size 32 at each epoch during training. Sequential random samplings (e.g., 32/40, 32/350 or 32/357) are performed during each training epoch. The last batch has a size less than 32 if the remainder is not zero. The NN model is trained for 500 epochs. The training is performed by iteratively updating the weights to minimize the mean absolute error (MAE) between actual and predicted energies, $$MAE(E, \hat{E}) = \frac{\sum_{k,b} |E(k,b) - \hat{E}(k,b)|}{(\text{number of } k\text{-points})(\text{number of bands})}. \quad (2)$$

We employ the ADAM stochastic optimization method for gradient descent to minimize the loss function (i.e., MAE). The high-level NNs are implemented using the Keras library [51]. In all NN models, the Rectified Linear Unit activation functions are utilized. Five-fold cross-validation tests are performed to avoid overfitting. The optimized weights, $$\min_{W} MAE(E, f(CN(r); W)), \qquad (3)$$

are then used to predict 21×21×21×12 $\hat{E}$ values for unknown systems.

The RF models [69] are shown to be computationally inexpensive and robust to overfitting of data [42]. The algorithm assembles results of several decision trees, each built from random selection of training data that include both features and example training energy values. The selected data is further partitioned into subsets based on decision rules that constitute branches of the tree. For example, the subsets can be formed based on order parameter values, e.g., $Q^{z,1}$~0.5-0.6, representing different atomic environments (see Table 1 above). The decision rules identify features that minimize the intrasubset variation of electronic energies. The leaves of the tree are then assigned to an energy value that maximizes fitting over the subset data.

Such tree generation process is then repeated for other random subsets of training data. The final predictions are obtained by averaging the predicted energies over all trees. We implement the RF module available in the scikit-learn Python package [70]. The input and output are identical to the ones used for the NN algorithm (see Table 2 below). We use 100 regression trees per ensemble and set all other parameters to default values recommended for the package. We did not observe any notable change in the predicted energy values by increasing the number of trees to 200 and 300.

TABLE 2

| Structures | Training set | Descriptors | Testing set | Property |
|---|---|---|---|---|
| Ideal SLs (strained) (FIG. 3) | 7 ordered units 7 applied strains 40 strained ordered units Each unit: 16 atoms | Global features VT-derived local features excluding Q 40 × 64 features Different subsets selected to show feature importance | 9 strained ordered units Each unit: 16 atoms | Energy bands, E (k, b) k × b = 21 × 21 × 21 × 12, per structure S from E (k, b) using BTE, n = $10^{18}$ cm$^{-3}$ to $10^{21}$ cm$^{-3}$ (200 values) |
| Ideal SLs (Relaxed) (FIG. 4) | 350 disordered units Each unit: 16 atoms | All features (global features, VT-derived local features including Q) 350 × 100 features Different subsets selected to show feature importance | 7 relaxed ordered units Each unit: 16 atoms | Energy bands, E (k, b) k × b = 21 × 21 × 21 × 12, per structure S from E (k, b) using BTE, n = $10^{18}$ cm$^{-3}$ to $10^{21}$ cm$^{-3}$ (200 values) |
| Non-ideal HSs (Relaxed) (FIG. 5) | 350 disordered units 7 relaxed ordered units Each unit: 16 atoms | All features as above 357 × 100 features Different subsets selected to show feature importance | 6 HSs with layers of uneven thickness 6 imperfect layer HSs Each structure: 32 atoms | Energy bands, E (k, b) k × b = 21 × 21 × 21 × 12, per structure S from E (k, b) using BTE, n = $10^{18}$ cm$^{-3}$ to $10^{21}$ cm$^{-3}$ (200 values) EBS: X – Γ (78 points), Γ – Z (38 points) |
| Fabricated HSs (Relaxed) (FIG. 5) | 350 disordered units 7 relaxed ordered units Each unit: 16 atoms | All features as above 357 × 100 features Different subsets selected to show feature importance | Si(5Å)Ge(7Å) SL: 8 Si & 8 Ge Si(20Å)Ge(20Å) SL: 112 Si & 112 Ge Si$_{0.7}$Ge$_{0.3}$ alloy: 45 Si & 19 Ge Si/Si$_{0.7}$Ge$_{0.3}$ HS with varied lengths: 224 (157 Si & 67 Ge) to 544 (477 Si & 67 Ge) | Energy bands, E (k, b) k × b = 21 × 21 × 21 × 12, for each test structure S from E (k, b) using BTE, n = $10^{18}$ cm$^{-3}$ to $10^{21}$ cm$^{-3}$ (200 values) |

1.4 Testing ML Predictions

In the following paragraphs, we discuss the performance of the two ML algorithms in predicting electronic transport coefficients of three classes of Si/Ge heterostructures as summarized in Table 2: (1) ideal superlattices, strained or relaxed (2) non-ideal heterostructures with irregular layer thicknesses and imperfect layers, and (3) fabricated heterostructures.

1.4.1 Ideal Superlattices: Strained and Relaxed

Figure 3A:
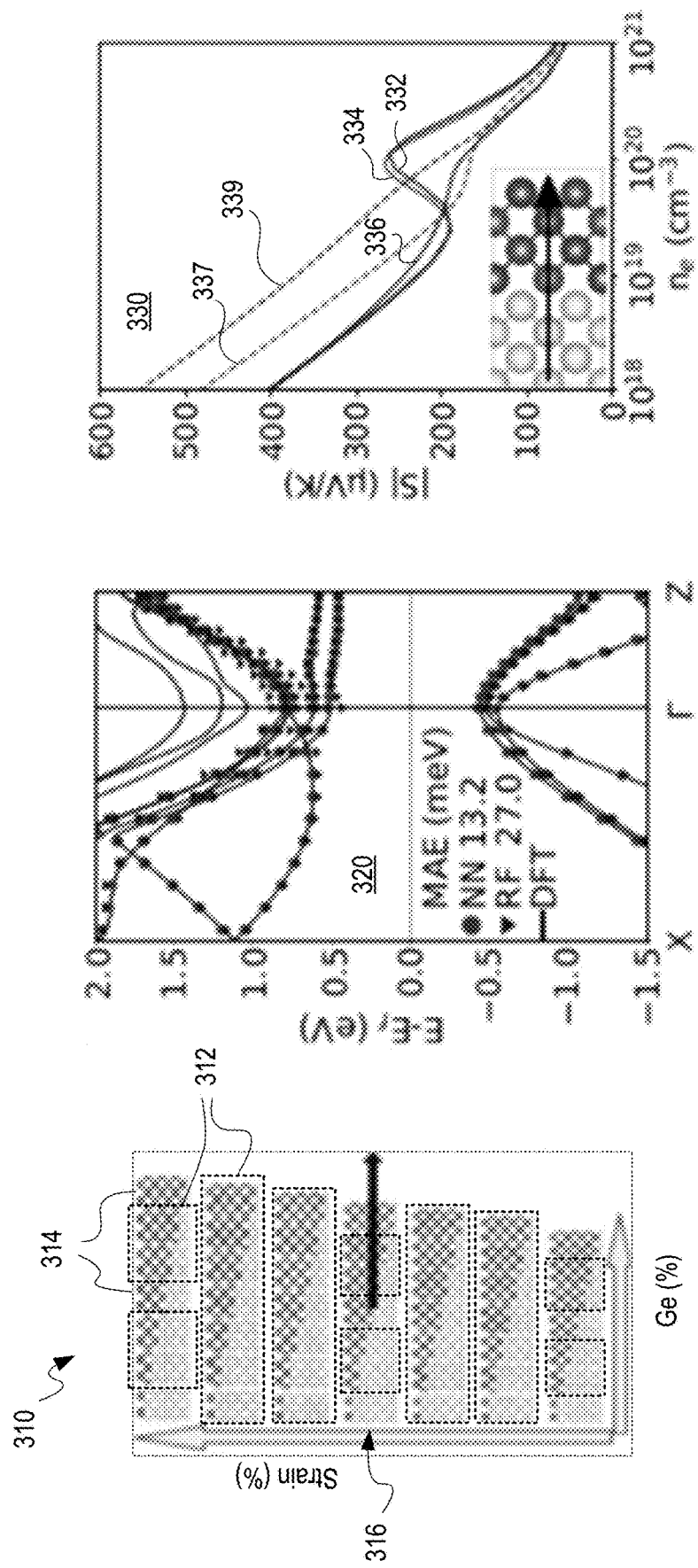
FIGS. 3A and 3B compare the performance between the supervised neural network and the random forests algorithms in the machine learning model shown in FIG. 1 on strained superlattices.
Figure 3B:
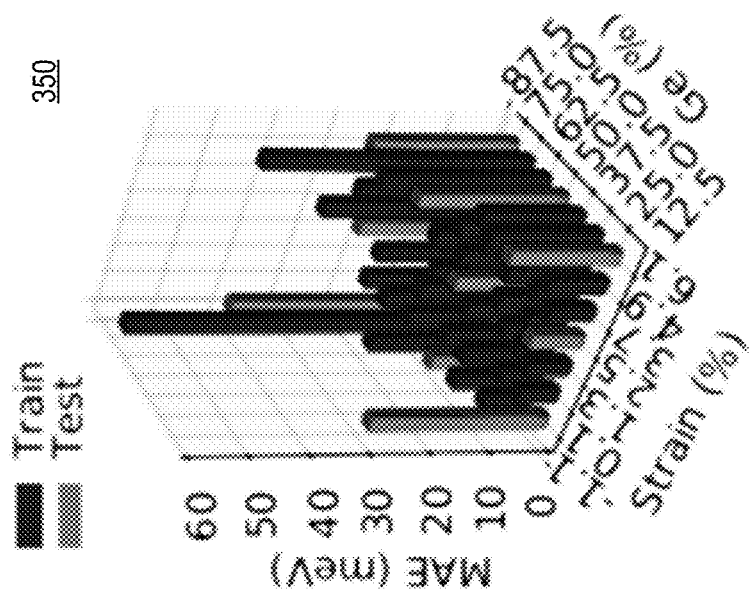
Figure 3B:
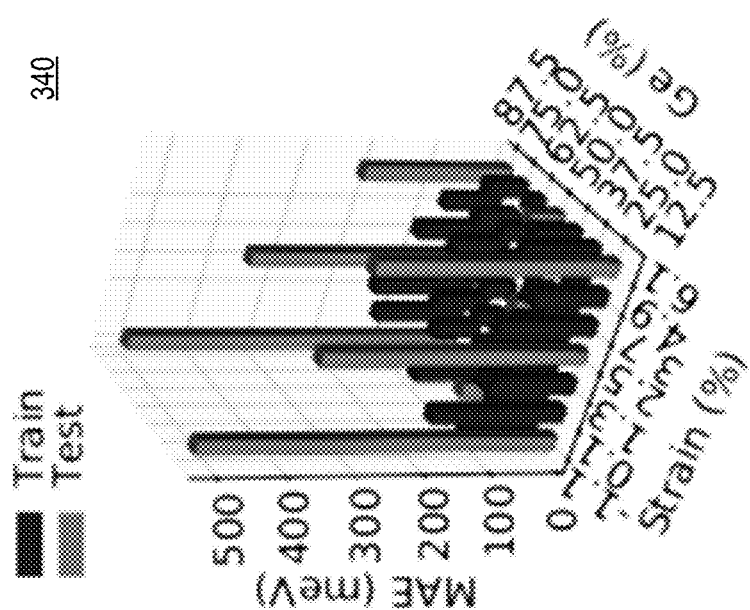

We test the effectiveness of our ETI framework in predicting the thermopowers of ideal SLs, considered to be grown on substrates inducing epitaxial strain. We use the term ideal to refer to SLs with sharp interfaces. FIGS. 3A and 3B compare the performance between the NN and the RF algorithms in the machine learning model 100 shown in FIG. 1 on strained superlattices. FIG. 3A shows a configuration schematic 310, a band structure plot 320, and a thermopower plot 330. The configuration schematic 310 shows representative configurations of 16-atom training units 312 and test units 314: ideal superlattices (SL) with varying compositions of Si/Ge atoms and external strain. Each configuration is subjected to global in-plane substrate strains of varying magnitude. The configuration schematic 310 shows seven applied strain values ranging uniformly from −1.1% to +6.1%, resulting in 49 different SLs. The schematic 310 shows configurations of 40 training units 312 of SLs and nine test units 314 of SLs. Strains in the range of ~3-4% have been observed in Si/Ge nanowire heterostructures with compositionally abrupt interfaces, grown using the VLS process of Ref [48]. We consider some extreme strains to probe the predictive power of our ML models.

A unit structure 316 in the middle is a relaxed $Si_4Ge_4$ SL, which corresponds to a strain-symmetrized $Si_4Ge_4$ SL along symmetry directions of a tetragonal BZ. The band structure plot 320 shows the energy bands of the unit structure 316, the relaxed $Si_4Ge_4$ SL, calculated with DFT (solid lines) and predicted by neural network (NN) (circle) and random forests (RF) (inverted triangle) algorithms. The thermopower plot 330 shows the thermopower traces 332, 334, and 336, each calculated from energy bands obtained with DFT, predicted by NN, and predicted by RF algorithms, respectively. Both NN and RF algorithms predict energies compatible with DFT results, with MAEs given by 13.2 meV and 27.0 meV, respectively. The MAE is calculated over all energy values, E(k,b), using Eqn. 2. More conduction bands are shown in the band structure plot 320 since these bands control the thermopower in the technologically relevant high doping regime of our interest.

In the thermopower plot 330, we show S of strain-symmetrized n-type $Si_4Ge_4$ SLs as a function of carrier concentration, $n_e$, which can be controlled by chemical or electrostatic doping methods [55]. Within BTE, S is obtained by integrating a function including band energies, Fermi-Dirac distribution function and transport distribution function [56] over the respective BZ. Thus, the discrepancy in predicted bands leads to an accumulated error in S prediction. The closer match of the NN-predicted lowest conduction bands with the DFT results in a better prediction of the resulting S.

The ML algorithms that resulted in thermopower traces 334 and 336 were trained with global features and local features from VT. Alternatively, thermopower traces 337 and 339 were calculated using respective predicted energy bands of NN and RF algorithms that were trained with only global features. The thermopower plot 330 shows that the predictions significantly improve when the ML models are trained using VT-derived features (traces 334 and 336) in addition to using only global features (traces 337 and 339). This result emphasizes the importance of considering local environment features in order to predict thermopowers with higher accuracy.

FIG. 3B shows MAE plots 340 and 350 of predicted bands of train and test structures for the RF and NN algorithms, respectively. MAE in both plots 340 and 350 is relatively small for small strain systems and higher for high strain boundary values. Both the algorithms yield small training MAE while their testing errors are considerably different. For example, the NN-predicted degenerate bands at ~0.8 eV along Γ–Z compare well with DFT results but the RF predictions deviate moderately. The bandgap is also predicted slightly better by the NN algorithm. For example, for the results shown in the band structure plot 320, the bandgap values are as follows: 0.947 eV (DFT), 0.944 eV (NN) and 0.914 eV (RF).

Figure 4A:
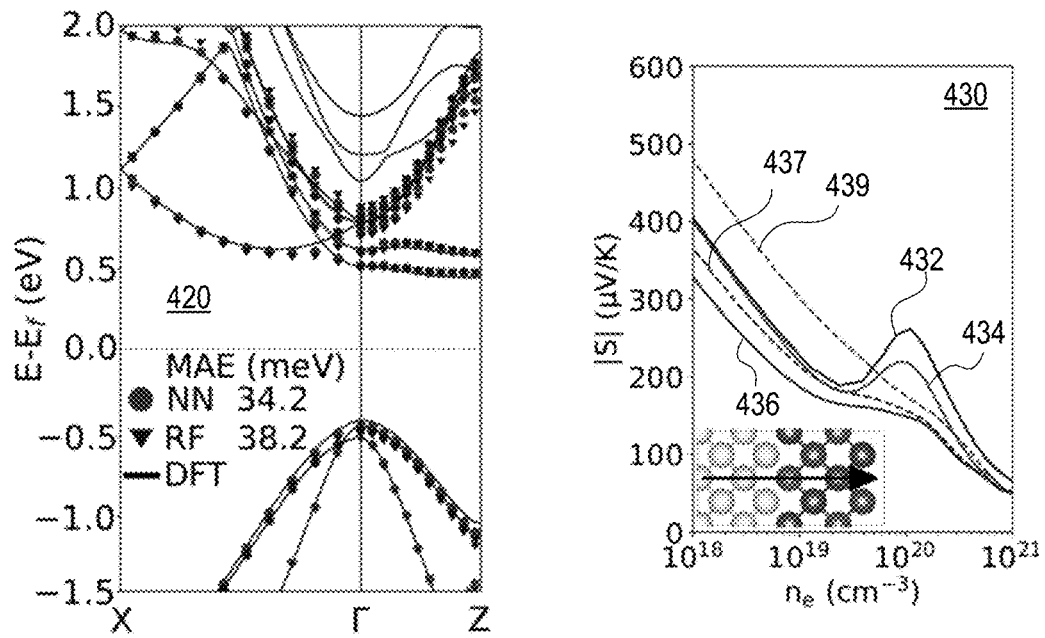
FIG. 4A shows an energy band plot and a corresponding thermopower plot of a strain-symmetrized $Si_4Ge_4$ SL of FIG. 3A using an alternate training strategy.

FIG. 4A shows an energy band plot 420 and a corresponding thermopower plot 430 of a strain-symmetrized $Si_4Ge_4$ SL, such as the unit structure 316 of FIG. 3A using an alternate training strategy. For the plots 420 and 430, the ML models were trained using disordered fragment units while the test of the ML models was done using ordered fragment units. The energy band plot 420 shows energy bands of relaxed $Si_4Ge_4$ SL predicted with ML algorithms and compared with DFT results. The ML algorithms were trained on 350 disordered units, and tested on 7 relaxed SL structures. The thermopower plot 430 shows thermopower traces 432, 434, and 436, which were obtained using DFT, predicted using NN, and predicted using RF, respectively. The ML models were trained with all VT derived features and the order parameters (Q). Alternatively, thermopower traces 437 and 439 were calculated using predicted energy bands from the NN and RF algorithms, respectively, where both models lacked the order parameters in the training.

Figure 4B:
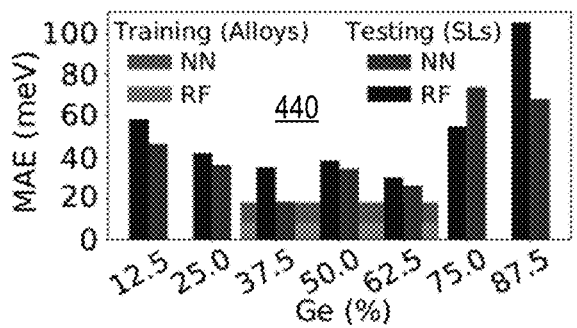
FIG. 4B shows a mean absolute error plot for the seven relaxed superlattice configurations of varying Ge concentrations used in the training of the machine learning models used in FIGS. 3A and 3B.

Even with the alternate training strategy, similar to the plots 320 and 330 in FIG. 3A, the predictions match DFT results closely, with MAEs of 34.2 meV (NN) and 38.2 meV (RF), respectively. The local atomic configurations-energy states relationship, $f(CN(r,E))$, is therefore preserved across configurations with different compositions. The thermopower plot 430 further highlights that training ML models including order parameter features improves S predictions. FIG. 4B shows an MAE plot 440 for the seven relaxed SL configurations of varying Ge concentrations used in the training of the machine learning models used in FIGS. 3A and 3B. The high MAE for the samples with the lowest and the highest Ge concentrations may be attributed to the limited number of disordered training units with similar Ge concentrations. The order parameter maps thus provide great insight into the expected performance of the ML models for different test structures. These results demonstrate that our ML models capture the necessary information regarding the true interatomic interactions present in these binary heterostructures in an unbiased manner. We leverage this knowledge and the central hypothesis to probe $f(CN(r),E)$ in 16-atom ordered and disordered fragment units, and extrapolate the insight to predict the energy states and transport coefficients of larger heterostructures as demonstrated below. We train the ML models with both global and VT-derived features to achieve this objective.

1.4.2 Non-Ideal Heterostructures

To further validate the ETI framework, the ML models are used to predict electronic transport properties of 32-atom non-ideal SLs. The two types of non-ideal SLs considered were (i) irregular layer thickness and (ii) imperfect layers. These systems are explorable with first-principles techniques, but larger in size compared to the 16-atom training units. The ML models predict energy bands sampling the first BZ of 16-atom models, as shown in the examples above. However, the 32-atom test systems have a smaller BZ and as a result, several bands are zone-folded. Additionally, as the system size increases, so does the number of bands in both valence and conduction zones. A band structure unfolding technique is employed that allows to identify effective band structures (EBS) by projecting onto a chosen reference BZ [51, 52]. We obtain the EBS of different 32-atom test configurations by projecting the DFT computed bands onto the BZ of 16-atom reference cells and compare with the ML predicted bands sampling a similar size BZ. This technique has been illustrated for different random substitutional alloy compositions: to probe to which extent band characteristics are preserved at different band indices, and k-points, compared to the respective bulk systems. Although this technique has not been applied to probe SL bands, the systems including non-ideal SLs are closer to alloy systems due to broken translational symmetry.

Figure 5A:
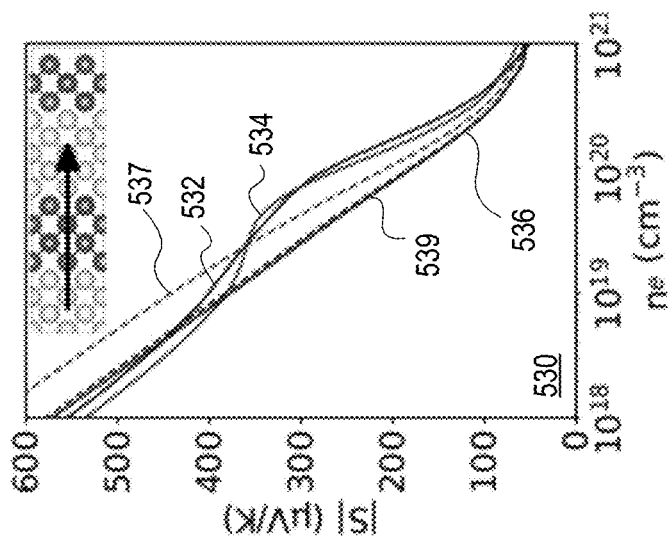
FIG. 5A shows a band structure plot and a thermopower plot of a 32-atom random multilayered heterostructure, $Si_4Ge_4Si_5Ge_3$, comparing the machine learning models used in FIGS. 3A and 3B.
Figure 5A:
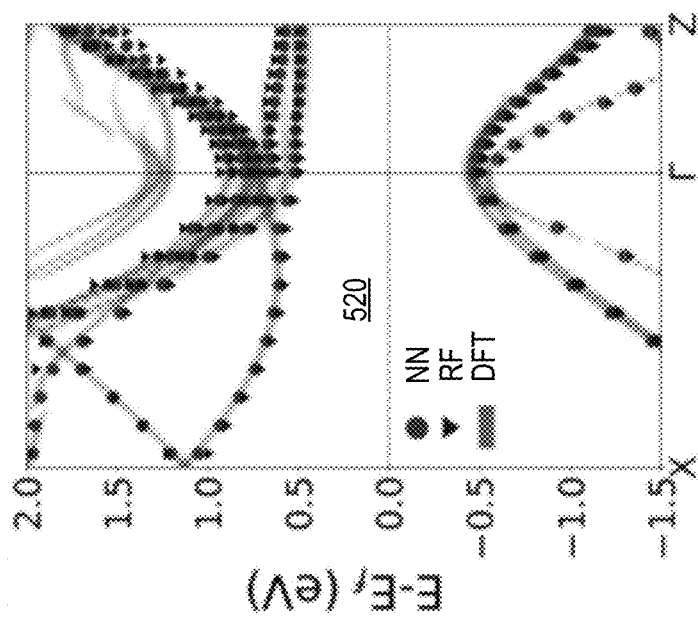

FIG. 5A shows a band structure plot 520 and a thermopower plot 530 of a 32-atom random multilayered heterostructure, $Si_4Ge_4Si_5Ge_3$, comparing the ML models used in FIGS. 3A and 3B. The band structure plot 520 shows effective band structure of the 32-atom multilayered heterostructure calculated using DFT and predicted band structures from the NN and RF models. The thermopower plot 530 shows thermopower traces 532, 534, and 536 that were calculated from the corresponding EBS calculated using DFT, predicted band structures using the NN model, and the RF model, respectively. While the thermopower traces 534 and 536 were calculated from the ML models trained using VT and the order parameters Q, respective dashed thermopower traces 537 and 539 were calculated from the ML models trained using only VT. The inset in plot 530 shows a representative test structure configuration.

Figure 5B:
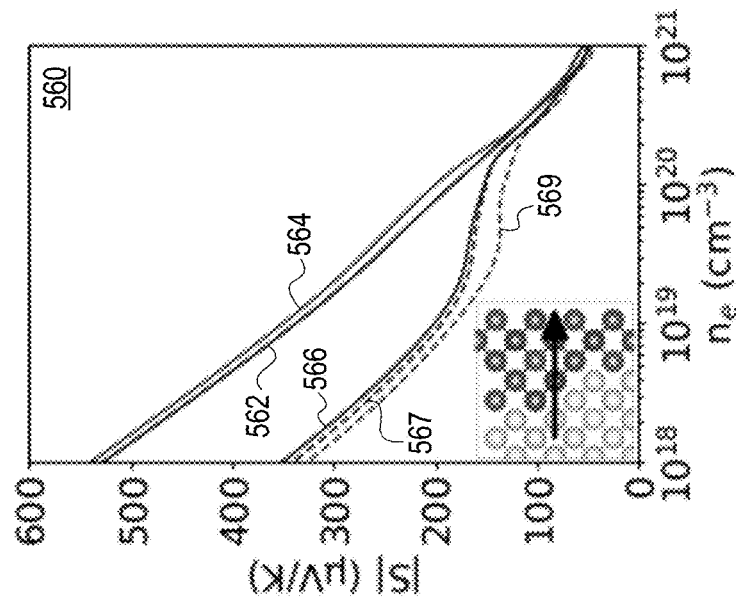
FIG. 5B shows a band structure plot and a thermopower plot of a 32-atom imperfect heterostructure comparing the ML models used in FIGS. 3A and 3B.
Figure 5B:
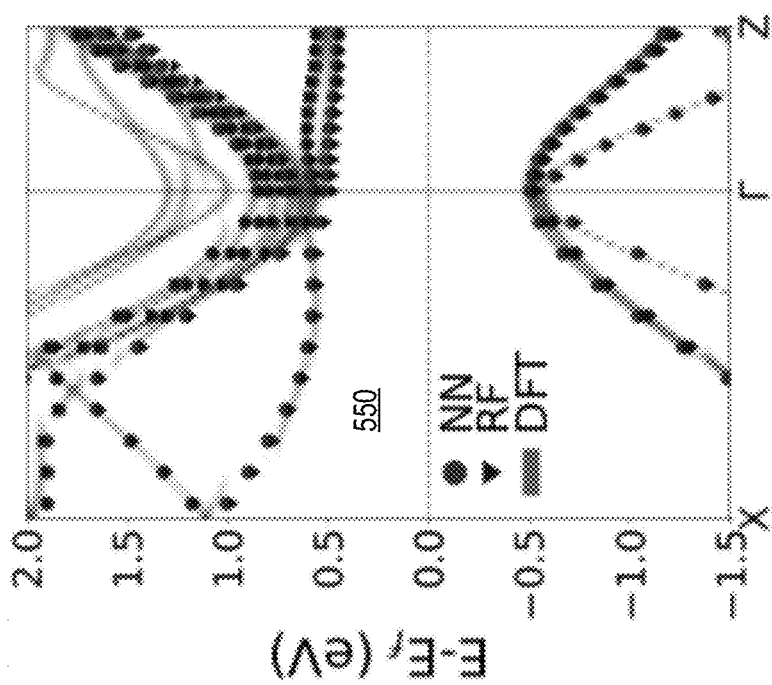

FIG. 5B shows a band structure plot 550 and a thermopower plot 560 of a 32-atom imperfect heterostructure comparing the ML models used in FIGS. 3A and 3B. The band structure plot 550 shows effective band structure of the 32-atom imperfect heterostructure calculated using DFT and predicted band structures from the NN and RF models. The thermopower plot 560 shows thermopower traces 562, 564, and 566 that were calculated from the corresponding EBS calculated using DFT, predicted band structures using the NN model, and using the RF model, respectively. While the thermopower traces 564 and 566 were calculated from the ML models trained using VT and the order parameters Q, respective dashed thermopower traces 567 and 569 were calculated from the ML models trained using only VT. The inset in plot 560 shows a representative test structure configuration.

In both FIGS. 5A and 5B, ML-predicted band structures agree with. Similar to the example shown in FIG. 4A, the NN algorithm provides a slightly better estimate of band gap. As shown in plot 430 in FIG. 4A, the inclusion of the order parameters (Q) is crucial for accurate prediction of thermopower.

1.4.3 Fabricated Heterostructures

As discussed above, due mainly to the required computational expense, the domain of application of first-principles approaches is often limited to ideal systems that do not reflect the structural complexity of experimental heterostructure. As a result, parametric approaches to predict electronic properties of experimental systems are often used. It is highly desirable to establish a bridge between the domains of (A) ab initio accessible ideal systems and (B) experimental systems realized with nanofabrication techniques, to acquire parameter-free predictions of electronic properties of real systems. Our training units, as shown in FIG. 1, fall within domain (A). A most challenging task faced by data-driven approaches arises in scenarios when the ML models are tested on cases that fall outside the domain of prior data. Below, we demonstrate that the ETI framework described herein successfully predicts electronic properties of test systems representing domain (B), and thus establishes a bridge between the two domains.

Figure 6A:
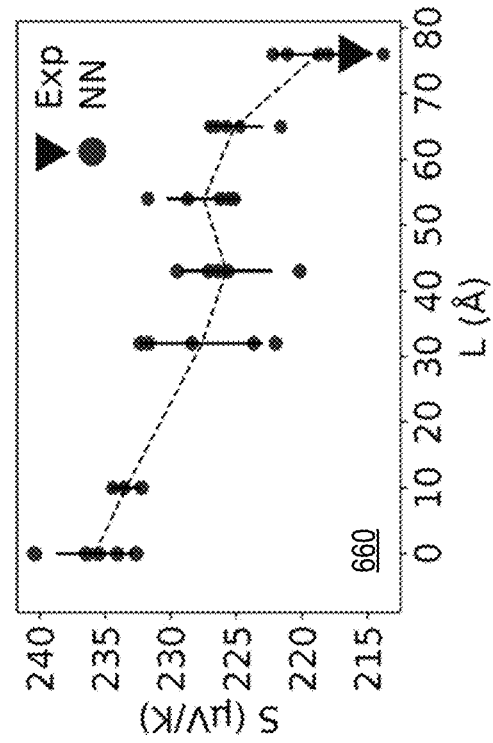
FIG. 6A shows predicted thermopower plots of a fabricated heterostructure system using the machine learning model shown in FIG. 1.

FIG. 6A shows predicted thermopower plots 610 and 620 of a fabricated heterostructure system using the ML model shown in FIG. 1. The ML model includes both the NN and RF models that were trained using the DFT data obtained from 16-atom fragment units, as described in reference to FIG. 1. Three system categories are considered for this example: (i) n-type Si/Ge SLs, and (ii) n-type SiGe alloys, and (iii) p-type Si/SiGe SLs.

The thermopower plot 610 shows measured data 612, 614, and 616 corresponding to respective categories crossplane thermopower of category (i) SL, in-plane thermopower of category (i) SL, and thermopower of category (ii) alloy. Measured data, to which the ML predictions were compared, are from Refs. [17, 53, and 54]. The measured data 612 is a cross-plane thermopower of n-type Si(5 Å)/Ge(7 Å) SL grown along [001] direction at 300K [53]. For the corresponding ML model traces 622 and 632 for the NN and RF models, respectively, features from a model Si/Ge SL with 8 Si and 8 Ge atoms were extracted to acquire the prediction. The measured data 614 are in-plane thermopowers of n-type Si(20 Å)/Ge(20 Å) SL grown along [001] direction at 300K [17]. For the corresponding ML model traces 624 (NN) and 634 (RF), the configurations included 112 Si and 112 Ge atoms in a relaxed geometry to extract features to obtain the ML prediction. The measured data 616 are thermopowers of n-type $Si_{0.7}Ge_{0.3}$ alloys at 300K [54]. For the corresponding ML model traces 626 and 636, the model was constructed by substituting 19 Si atoms with Ge in a 64-atom bulk Si supercell.

The ML predictions show a good agreement for both cross-plane and in-plane thermopowers across all different carrier concentrations. The small deviations between ML results and experimental data can be attributed to the differences between local environments in the models and the experimental samples. We anticipate that the error in ML prediction would fall within experimental uncertainties. This comparison also reveals that ML predictions can be utilized to optimize the thermopowers of these systems by varying carrier concentrations.

Figure 6B:
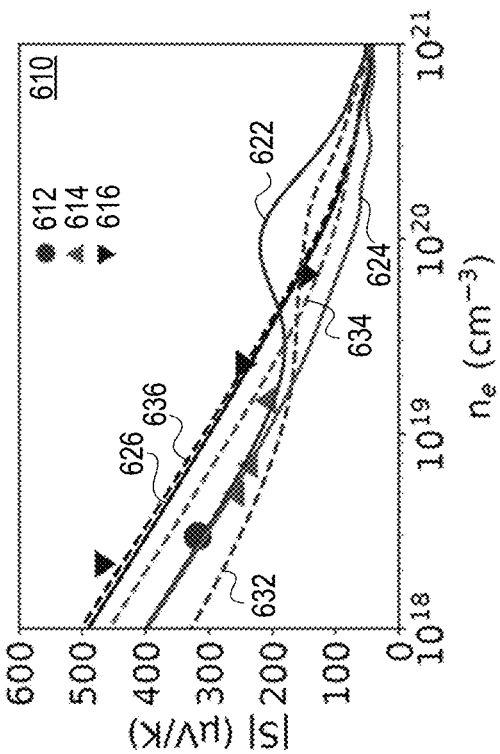
FIG. 6B shows a representative configuration of a $Si/Si_{0.7}Ge_{0.3}$ superlattice used in the prediction of thermopower in FIG. 6A.
Figure 6B:
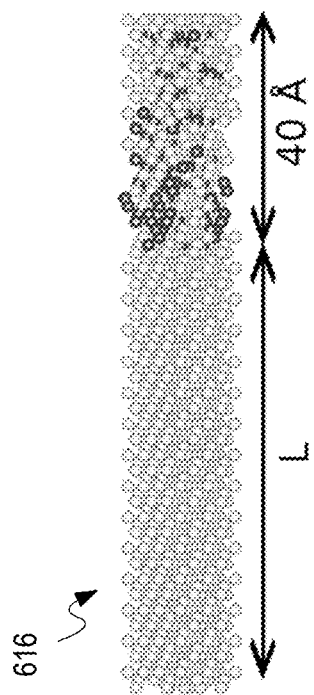

Additionally, the thermopower plot 660 shows measured data 662 corresponding to category (iii) of p-type Si/SiGe SLs along with thermopower predictions from the NN model. FIG. 6B shows a representative configuration 650 of a $Si/Si_{0.7}Ge_{0.3}$ superlattice used in the prediction of thermopower in the plot 660. Model configuration 650 has a carrier concentration $n_e=1.5\times10^{19}$ cm$^{-3}$, as a function of varying Si layer thickness (L). We model systems with a constant width alloy region and varied L. The thermopower plot 660 shows that our predictions approach the experimental data obtained for the $Si(80 Å)/Si_{0.7}Ge_{0.3}(40 Å)$ SL grown on a Si substrate [55] as L approaches L 80 Å. For each system with a given L, the spread in ML data refers to five models with different randomized substitutional alloy configurations. Our results showing the extrapolating power of the framework reveal that thermopower of Si/SiGe SLs can be optimized by choosing an appropriate system size guided by ML prediction. Training ML models with these relationships $f(CN(r), E)$ allows us to predict electronic transport properties of experimental heterostructures. This physics-based extrapolation is thus possible because of accumulating knowledge from "known" environments.

2. Scalability of ETI Framework

Figure 7:
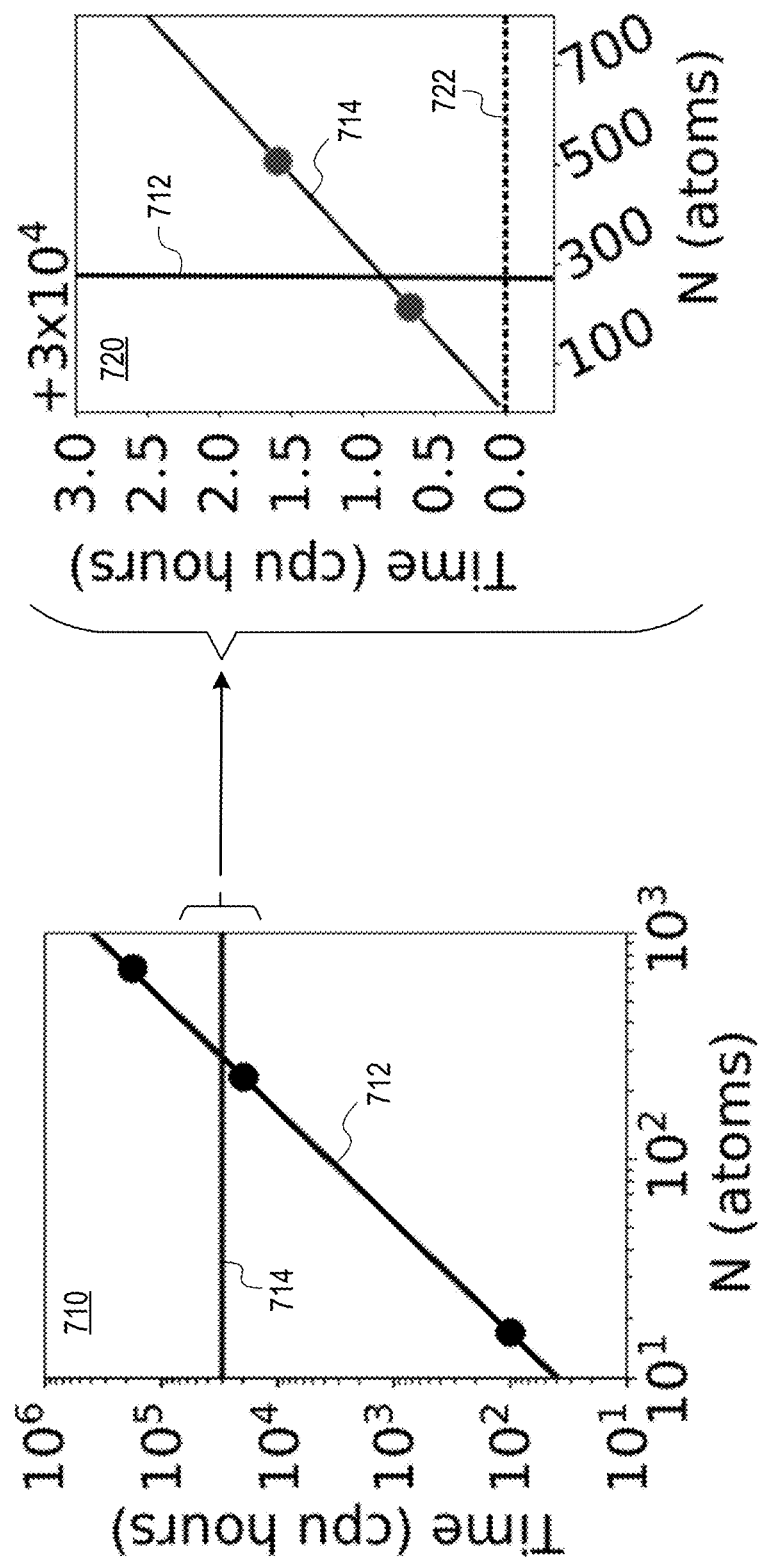
FIG. 7 shows comparison plots that illustrate an example study of the cost difference associated with using density functional theory and the electronic transport informatics framework of FIG. 1.

To further validate the ETI framework of FIG. 1 in correlating the ab initio accessible models to fabricated systems, we explore the scalability of our framework with increasing system size. FIG. 7 shows plots 710 and 720 that illustrate an example study of computational cost comparison between using DFT and the ML model 100 of the ETI framework. The plot 720 is a subset of the plot 710 to highlight the computational cost associated with using the ML model 100 of ETI framework to predict the electronic properties. The plots 710 and 720 show traces 712 and 714 that represent the computational cost with an increasing system size (e.g., number of atoms) when using DFT and the ML model 100 of the ETI framework, respectively. The plot 720 shows a baseline 722 for the ML models. The baseline 722 indicates the time required to generate the training data with DFT. The trace 714 for the ML models includes feature extraction time of DFT-relaxed test configurations. The plot 710 shows that runtime for DFT calculations scales as $\sim N^2$ while that for feature extraction scales linearly with N, where N is the number of atoms. The example of FIG. 7 illustrates the advantage of the ETI framework for parameter-free prediction of thermopowers of large structures that may not be fully accessed with DFT alone.

In summary, we demonstrate that the problem of predicting electronic properties of technologically relevant heterostructures may be solved by combining first-principles methods with ML techniques into a physics-aware ETI framework. We incorporate the physics awareness in the ML approach in two ways: (1) providing carefully chosen training data to bias the learning and (2) formulating descriptors that can successfully characterize functional relationships, $f(CN(r),E)$, between local atomic configurations and global energy bands. We illustrate that physics-informed ML models are capable of formulating transferable relationships, $f(CN(r),E)$, from the large body of atomistic data generated with individual DFT calculations of 16-atom ordered (layered) and disordered (alloy) semiconductor structures with diverse atomic environments. Furthermore, applicability of the ML models to predict energy bands (E) of fabricated nanostructures is discussed above. We thus use ML techniques to overcome the challenges to calculate energy bands using first-principles techniques, and compute thermopower from the predicted E's. The predicted thermopowers of fabricated heterostructures show agreement with measured data. The proposed ETI framework thus establishes a bridge between ideal systems accessible with first-principles approaches and real systems realized with nanofabrication techniques.

The relationship between fabrication dependent structural parameters and electronic properties of heterostructures is complex and often cannot be fully explored with first-principles approaches. Our study demonstrates that physics-informed ML techniques may successfully be used to formulate them. The functional relationships between local atomic configurations, and their contributions to global energy bands remain preserved when the local configurations are part of a nanostructure with different composition and/or dimensions. Transferability of these functional relationships is the key physical understanding from this study. Our framework proposes a data driven approach to extract important physics that determines electronic properties of heterostructures and allows to extend the applicability of first-principles techniques for technologically relevant heterostructures. For example, this approach may allow the predictions of properties of alloyed thermoelectric materials with diverse nanostructures, formed by segregated structures, partial solid solutions or completely random solid solutions, which appear in real materials. It may also allow researchers to predict the best nanostructure to achieve maximum Seebeck coefficient for different classes of thermoelectric materials. This viewpoint may give the ETI framework broad applicability to diverse materials classes.

3. Method

Figure 8:
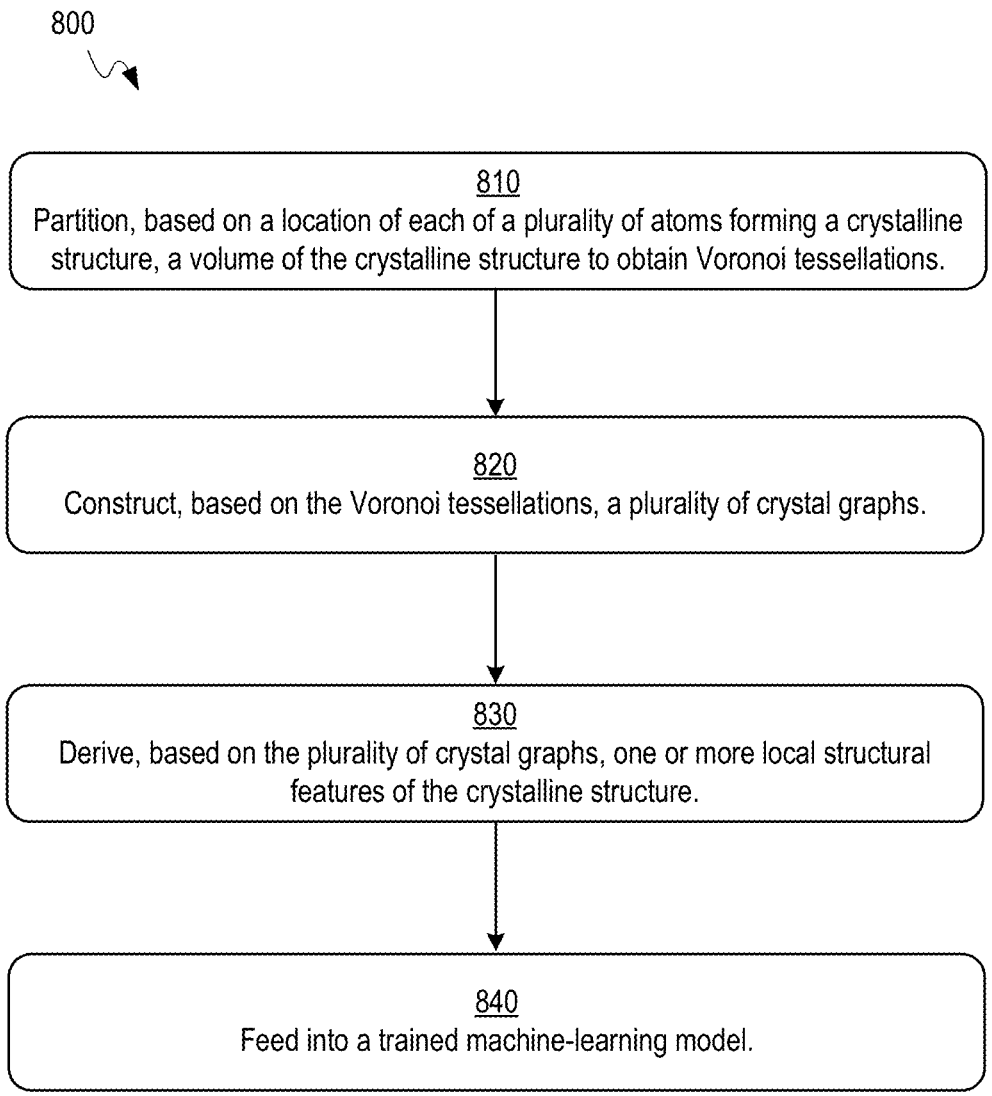
FIG. 8 illustrates a method of determining electronic band structure, in an embodiment.

FIG. 8 illustrates a method 800 of determining electronic band structure. The method 800 includes steps 810, 820, 830, and 840. The method 800 may be implemented in a system that includes a processor, a memory in electronic communication with the processor, a trained ML model stored in the memory, and machine-readable instructions stored in the memory. The steps 810, 820, 830, and 840 of the method 800 may be included in the machine-readable instructions that are executed by the processor.

Step 810 includes partitioning, based on a location of each of a plurality of atoms forming a crystalline structure, a volume of the crystalline structure to obtain Voronoi tessellations. In an example of step 810, in FIG. 1, a heterostructure is fragmented into 16-atom fragment units, each unit having local atomic configuration. An example VT of a $Si_4Ge_4$ superlattice is shown in FIG. 2B.

Step 820 includes constructing, based on the Voronoi tessellations, a plurality of crystal graphs. In an example of step 820, FIG. 2A illustrates an example crystal graph of a Si/Ge configuration that show the neighboring atoms identified from the VT of FIG. 2B.

Step 830 includes deriving, based on the plurality of crystal graphs, one or more local structural features of the crystalline structure. In an example of step 830, local features that describe local environment are shown in FIG. 2C, which has features such as nodes representing atoms and edges representing connections to other neighboring atoms in the structure. Details of individual features are described in Section 5 below.

Step 840 includes feeding into a trained machine-learning model, the one or more local structural features, one or more global structural features of the crystalline structure, and one or more species-based features of the crystalline structure. In an example of step 840, machine learning models including the NN and RF algorithms are trained with features from the step 830, CN(r), and established a relationship to electronic structure of the heterostructure, $f(CN(r),E)$. The output of the trained ML models is a predicted band structure, E, that may be used to calculate the Seebeck coefficient.

4. Details

In the following sections, details involving training and testing of the ML models and calculations of critical parameters, such as effective band structures and Seebeck coefficients, are described. These details are presented as examples of constructing and using the ETI framework of FIG. 1.

4.1 Details of Training and Testing System

Ordered Units: We construct model $Si_nGe_m$ SL fragment units with different compositions to generate the training data, where n and m refer to the number of Si and Ge monolayers (ML), respectively. We create a $Si_nGe_m$ (n+m=8) fragment unit supercell by replicating a 8-atom conventional Si unit cell (CC) twice along the symmetry direction [001] and replacing m Si monolayers with Ge atoms, since both Si and Ge have stable FCC diamond lattice structures [56. 57]. By replacing Si monolayers (ML) with Ge, we obtain 7 $Si_{8-x}Ge_x$ SLs, where x is the number of MLs: x=[1, 2, . . . 7]. To generate train and test strained SL structures, we consider applied strains ranging uniformly from −1.1% to +6.1% with a total of 7 different strain values, resulting in 49 different SLs, as shown in FIG. 3A. To simulate SLs under applied strain the in-plane lattice constants were fixed: (−1.1%, 0.1%, 1.3%, 2.5%, 3.7%, 4.9%, 6.1% of bulk Si lattice constant) while keeping the volume of the cell fixed and letting the atomic positions and shape of the cell relaxed along the cross-plane [001] direction. We estimate the in-plane strain in the SLs from the lattice constants by $\epsilon_{\parallel}=(\alpha_{\parallel}/\alpha_{si}-1)$ with $\alpha_{si}=5.475$ Å [58].

Disordered Units: We model the disordered $Si_nGe_m$ fragment units with different compositions to generate the training data, where n and m refer to the number of Si and Ge atoms, respectively. The disordered SiGe structures are prepared with similar 16 atom supercells, two conventional 8-atom cells (CC) stacked along the [001] direction. For each chosen Ge concentration (5/16, 6/16, 7/16, 8/16, 9/16, 10/16, 11/16), we generate 50 substitutional "alloy" configurations, resulting in 350 total disordered fragment training units.

Non-Ideal Heterostructure Models: The non-ideal heterostructures shown in FIGS. 5A and 5B are modeled with 32 atom supercells (4 CCs). The systems are constructed by stacking 16-atom units with atomic composition $Si_nGe_m$ and $Si_pGe_q$, where n+p=8 and m+q=8 along z-direction for the multilayered systems and along x-direction for the imperfect layer heterostructures. The resulting stoichiometry of the test configurations can be represented as $Si_nGe_mSi_kGe_l$ with n+m+k+l=32, n≠k, and m≠l.

Fabricated Heterostructure Models: We model the Si(5 Å)/Ge(7 Å) SL shown in FIG. 6A with 1×1×2 CCs that include 8 Si and 8 Ge atoms. We construct the model Si(20 Å)/Ge(20 Å) SL with 2×2×7 CCs including 112 Si and 112 Ge atoms. The $Si_{0.7}Ge_{0.3}$ alloy is modelled using a randomly substituted 64-atom 2×2×2 CCs system that includes 45 Si and 19 Ge atoms. The fabricated structures shown in FIG. 6B are modeled with a $Si_{0.7}Ge_{0.3}$ random alloy region (2×2×7 CCs: 157 Si and 67 Ge atoms) and a Si layer of varied lengths between 0 and 10 CCs to (0 to 320 Si atoms). We model systems with total size varied from 2×2×7 (157+67=224 atoms) to 2×2×17 CCs (157+67+320=544 atoms) by increasing L and keeping the width of the alloy region constant to 2×2×7 CCs. For each system with a given L, we model the substitutional alloy region with five different randomized configurations.

We compute the features of the test non-ideal and fabricated heterostructures from their relaxed geometry configurations, to ensure that the initial bias in preparing the model configurations does not affect our ML predictions. In this study, we use the Broyden-Fletcher-Goldfarb-Shanno Quasi-Newton algorithm, as implemented in Vienna Ab Initio Simulation Package (VASP) [59, 60], for geometry relaxation without any applied constraints (as discussed below). We provide the test features as input to the ML models and task it to predict the energy bands.

4.2 Details of DFT Computation

The relaxed geometries of the structures are obtained using the VASP package. The lattice constants and the atomic positions in $Si_nGe_m$ structures are optimized using Broyden-Fletcher-Shanno Quasi-Newton algorithm, sampling the Brillouin zone (BZ) with 8×8×8 k-point mesh. To simulate SLs under applied strain, we keep the cell volume fixed and relax the cell shape in cross-plane [001] direction. We perform the electronic structure calculations with DFT using the generalized gradient approximation (GGA) implemented in the VASP with the Perdew-Burke-Ernzenhof (PBE) exchange-correlation functional [61]. The ultra-soft projector-augmented wave (PAW) pseudopotential [62, 63] with a cutoff energy of 400 eV was used to describe the interaction between the valence electrons and the ions. For the self-consistent calculations, the energy convergence threshold was set to $10^{-6}$ eV. Spin-orbit interaction is not included in the analysis since the magnitude of the lattice strain induced splittings is larger than the spin-orbit splittings [64]. The electronic bands are plotted along the Γ–Z symmetry direction of the BZ with 11 points resolution. Following relaxation, we perform non self-consistent field (NSCF) calculations to obtain the energy bands using a dense Γ-centered 21×21×21 Monkhorst-Pack k-point mesh [65], to sample the irreducible Brillouin zone (IBZ). Such sampling is necessary to converge the calculation of the electronic transport coefficients [34, 35]. Once the electronic structure calculations are completed, we employ the semiclassical Boltzmann transport theory [66] as implemented in BoltzTraP code [67] to compute the room temperature Seebeck coefficients. The k-point mesh is chosen after performing systematic studies to converge Seebeck coefficients with increasing mesh size.

4.3 Effective Band Structures

Following the approach outlined in Ref [51], we transform the band structures of larger configurations into EBS of a reference cell consisting of 16 atoms, using spectral decomposition [71]. The reference cell contains the same number of atoms as the training units and is approximately of the same size as 2 CCs stacked along [001] direction. However, the dimensions of the reference cells that each test configuration is projected to are different, and are obtained by dividing the supercells as multiples of 2 CCs and taking an average. We calculate the eigenstates $|\vec{K}m\rangle$ of the test supercells using DFT, sampling the BZ with a 21×21×21 K-point mesh, where m is the band index. The spectral weight that quantifies the amount of character of Bloch states $|\vec{k}_i n\rangle$ of the reference unit cell preserved in $|\vec{K}m\rangle$ at the same energy $E_m = E_n$, can be written as $$P_{\vec{K}m}(\vec{k}_i) = \sum_n |\langle \vec{K}m | \vec{k}_i n \rangle|^2. \qquad (4)$$

Here, $k_i = K + G_i$, $G_i$ being the translational vector of a reciprocal lattice of the supercell BZ in the reference cell Brillouin Zone [51]. The spectral function (SF) can then be defined as $$A(\vec{k}_i, E) = \sum_m P_{\vec{K}m}(\vec{k}_i) \delta(E_m - E), \qquad (5)$$

where E is a continuous variable of a chosen range over which we probe for the preservation of the Bloch character of the supercell eigenstates. The delta function in Eqn. 5 is modeled with a Lorentzian function with width 0.002 eV. $A(\vec{k}_i, E)$ are normalized by dividing the spectral functions by $\max_{\{\vec{k}_i, E\}}[A(\vec{k}_i, E)]$.

4.4 Seebeck Coefficients

We compute the Seebeck coefficients using the semiclassical BTE as implemented in the BoltzTraP code [67]. All thermopower calculations are performed at room temperature and for technologically relevant high doping regime ranging from $n_e = 10^{18}$ to $10^{21}$ cm$^{-3}$. S is obtained from $(1/eT)(\mathcal{L}^{(1)}/\mathcal{L}^{(0)})$, where e is the electron charge, T is temperature, and the generalized in-plane ($\parallel$) or cross-plane ($\perp$) $n^{th}$-order conductivity moments are, $$\mathcal{L}^{(n)}_{\parallel,\perp}(\epsilon_F, T) = \int d\epsilon \sum_{\parallel,\perp}(\epsilon)(\epsilon - \epsilon_F)^{(n)}\left(-\frac{\partial f}{\partial \epsilon}\right). \qquad (6)$$

The integrand is computed from the energy difference ($\epsilon - \epsilon_F$) to the $n^{th}$ power, the Fermi energy level ($\epsilon_F$), the derivative of the Fermi-Dirac distribution function ($f$) with respect to energy $\epsilon$, and the transport distribution function (TDF) [50]. TDF can be expressed as $$\Sigma_{\|,\perp}(\epsilon) = \frac{\tau}{\hbar(2\pi)^3} \oint_{\epsilon_k = \epsilon} \frac{d\mathcal{A}}{|v_k|} (v_{k,(\|,\perp)})^2, \quad (7)$$

within the constant relaxation time ($\tau$) approximation. The area-integral is given by the DOS $$\left( \propto \oint_{\epsilon_k = \epsilon} \frac{d\mathcal{A}}{|v_k|} \right)$$

weighted by the squared group velocities, $(v_{k,(\|,\perp)})^2$. The carrier concentrations $n_e$ are obtained from the knowledge of the electronic bands and the Fermi level: $n_e = \int d\epsilon \, DOS(\epsilon) f_{\epsilon_F}(\epsilon,T)$. The PBE-GGA approach poorly predicts semiconductor band gaps [72, 73], as opposed to using hybrid functionals [74]. Nevertheless, the PBE-GGA approximation has been regularly employed to compute the electron/hole transport coefficients of semiconductors, including thermoelectric properties of [111]-oriented Si/Ge SLs [37]. These studies demonstrate the effectiveness of the PBE-GGA approximation to depict the role of lattice environment on electronic properties of Si-based systems. In previous publications, we discussed the discrepancy in bandgap predictions in detail [34] as well as shown comparisons of S of $Si_4Ge_4$ SLs predicted using the Heyd-Scuseria-Ernzerhof [75] and the PBE functionals [35]. We find that the PBE-predicted S vs $n_e$ relationship closely follows the HSE prediction for low strain cases, and shows small deviations at low doping concentrations for high strain cases, which can be attributed to bandgap discrepancies [41]. In addition, we tested that using a scissors operator for band gap correction using the HSE predicted gaps (See Ref [35]) or experimental band gap, essentially leaves the S vs $n_e$ curve unchanged. This systematic analysis showed the robustness of our results highlighting the relationship between lattice environment and electronic transport in heterostructures, independent of the numerical approach used, and motivated us to use PBE-GGA-BTE approach to analyze the thermopowers of $Si_nGe_m$ heterostructures. In this disclosure, we use a static correction ($U_{GGA} = 0.52$ eV [37]) to match the PBE predicted band gap to the measured band gap value for bulk silicon. The PBE approach is especially suited for data driven studies since it is far less expensive compared to a more accurate hybrid functional. For example, the electronic bands calculation of a $Si_4Ge_4$ SL using PBE, over a 21×21×21 k-point mesh, required 31 CPU hours and compared to 1075 hours of CPU time when using the hybrid functional.

We used a constant relaxation time ($\tau$) approximation (CRTA) for all the calculations presented herein. This approximation allows us to calculate S without any free parameters. It is a common practice to obtain $\tau$ by fitting experimental mobility data for specific carrier concentrations with empirical approximations, and adjust the first-principle results accordingly to reproduce experimental findings. For example, the first-principles estimation of electronic transport properties of strained bulk Si used relaxation times fitted from the measured mobility data of unstrained Si [37]. One main reason is that first-principles computation of $\tau$ is highly expensive for model systems containing greater than a few atoms. As a result, only a handful of previous studies exist that analyzed the electronic properties of highly technologically relevant Si/Ge heterostructures using first-principle methods, especially with including the complex effects of strain or non-idealities. It is known that strain could alter the dominant scattering processes in bulk Si [76], however, the role of different scattering mechanisms on electron relaxation in Si/Ge heterostructures due to lattice strain or defects is relatively unexplored. The CRTA may not capture the full physics, particularly, the effects of electrons scattering due to phonons and ionized impurities on the electronic transport properties of our interest.

Ref [34] estimates the relaxation time assuming the electron-phonon scattering rates in non-polar semiconductors generally are proportional to the density of states (DOS) and provides a comparison between S computed with constant $\tau$ and with $\tau(\epsilon) \propto 1/DOS$. Ref. [34] also notes that S trends match quite well between the two approximations, although the exact values differ. A similar approach is taken herein to compute the electronic transport coefficients. For brevity, the focus of this disclosure includes establishing that the local functional relationships in small models may be utilized to achieve parameter free prediction of the electronic transport properties of fabricated heterostructures. And we have provided a proof of concept by demonstrating that our predictions, made using a constant relaxation time, match the measured data for three classes of fabricated heterostructures. We primarily use ML techniques to overcome the challenges of calculating energy bands using first-principles techniques. We anticipate that one can predict electronic properties with higher accuracy using our ETI framework by providing training set data, obtained using higher accuracy models or implementing sophisticated transport models.

5. Detailed Description of Features

In this section we describe the various geometrical and physical features we used to train the ML model. Our choice of features and their functional forms closely follow the feature categories implemented by Ward et al. [42], with slight modifications, as we discuss below. In total, our method describes each configuration by 100 features of the following categories.

5.1 Global Structural Features

We include a set of global structural features based on the lattice parameters and compositions of the structures. We compute the effective lattice constant features a, b, and c by dividing the Si/Ge structure dimensions ($L_x$, $L_y$, $L_z$) with the number of conventional cells of which the corresponding dimension is comprised of ($N_x$, $N_y$, $N_z$), respectively. The atomic composition of Si and Ge in a given structure is also included as a global atomic feature, calculated from the fraction of atoms of a given type present in the structure. In total, a given configuration is described by four global features a, b, c, and Ge concentration. We could have chosen Si concentration in the configurations as well, since in these binary systems they are complementary of each other. In total, our method describes each configuration by four global physical features.

5.2 Local Features

The main idea in our approach is to represent the crystal structure by a crystal graph that encodes both atomic information and bonding environment between atoms, and then use the graph to extract features that are optimum for predicting electronic transport properties by training with DFT calculated data. In FIG. 2, a crystal graph G is shown, defined by nodes representing atoms and edges representing connections between atoms in a structure. The crystal graph allows multiple edges between the same pair of end nodes. Each node i is represented by a feature vector $v_i$, encoding the property of the atom corresponding to node i: $v_i :=$ [elemental-property, structural factors {effective coordination number (ECN), maximum packing efficiency (MPE), environment heterogeneity (EH), local ordering (Q)}]. Below, we provide the details of the feature elements.

5.3 Elemental-Property Features

These features are based on the difference in atomic elemental properties between a central atom and its neighbors. The local property difference for each atom is defined as the Voronoi face area weighted mean of the absolute difference in the elemental property between a central atom and each of its neighbors:

$$\delta_p = \frac{\Sigma_n A_n * |p_n - p_i|}{\Sigma_n A_n}, \tag{8}$$

where $\delta_p$ is the local property difference for elemental property p, $p_i$ is the elemental property of the central atom, $p_n$ is the elemental property of neighboring atom n, and $A_n$ is the area of the face adjacent to neighbor n.

We compute the mean, mean absolute deviation, maximum, and minimum of the distribution of local elemental property difference in a configuration, to compute the local elemental-property features. Our models contain only two atom types in the configurations (Si and Ge). Therefore, the elemental properties vary only slightly in the configurations, yielding a small variation in the local element property features values. We consider only one elemental-property based feature, computed from the difference in electronegativities of the atoms. In total, our method describes each configuration by four local elemental-property based features.

5.4 Effective Coordination Number

As in Ref. [42], we define the effective coordination number of an atom X by a function of the face areas of its Voronoi polyhedron:

$$CN_{eff} = \frac{(\Sigma_n A_n)^2}{\Sigma_n A_n^2}, \tag{9}$$

where $A_n$ is the area of face n of a single Voronoi cell in the tessellation, enclosing the volume around atom X. An example of Voronoi cell is Voronoi cell 202 of FIG. 2C in the interface region of a representative binary heterostructure. We describe each configuration by four effective coordination number features. We compute the maximum, minimum, mean, and mean absolute deviation (MAD) in effective coordination numbers over all the atoms in a given configuration, and consider them as features. The mean absolute deviation ($\hat{f}$) of a quantity (f) is defined as $$\hat{f} = \frac{1}{N} \sum_i |f_i - \bar{f}|, \tag{10}$$

where $f_i$ is the value of the $i^{th}$ sample, N is the number of samples, and $\bar{f}$ is the mean.

5.5 Maximum Packing Efficiency

To estimate the maximum packing efficiency for each atom, we divide the volume of the largest sphere centered on the atom that can be placed inside its Voronoi cell, by the volume of the cell. The mean, mean absolute deviation, maximum, and minimum of the distribution of maximum packing efficiency in a configuration are used as the features. In total, our method describes each configuration by four maximum packing efficiency features.

5.6 Environment Heterogeneity Features

These features are designed to measure the variation in the local bonding environments due to strain in the structures.

5.6.1 Effective Bond Length

We define the effective bond length of an atom i, $\bar{l}_i$, as the Voronoi-face-area-weighted average of the absolute distance between the atom and each of its neighbors, $$\bar{l}_i = \frac{\Sigma_n A_n * \|\vec{r}_n - \vec{r}_i\|_2}{\Sigma_n A_n}, \tag{11}$$

where $\vec{e}_l$ is its position, and $A_n$ and $\vec{r}_n$ are the face area and the position of the $n^{th}$ neighbor, respectively. We describe each configuration by four effective bond length features: the maximum, the minimum, the mean, and the mean absolute deviation of effective bond lengths among all the atoms in a given configuration.

5.6.2 Bond Length Variance

The bond length variance reflects the distribution in bond lengths between each neighbor of an atom, and is computed by:

$$\hat{l}_i = \frac{\Sigma_n |A_n * \|\vec{r}_n - \vec{r}_i\|_2 - \bar{l}_i|}{\bar{l}_i \Sigma_n A_n}, \tag{12}$$

with the symbols representing quantities as described above. Unlike Ref [42], we do not normalize these features in order to capture the variation in the effective bond length due to changes in the strain environments. Our method describes each configuration by four effective bond length variance features: the maximum, the minimum, the mean, and the mean absolute deviation of bond length variance values.

5.6.3 Voronoi Cell Volume

We construct a Voronoi cell volume segment as a polyhedron with the central atom as a vertex and one of its surface faces as a base. For example, we can construct 12 such volume segments for each atom in a perfect FCC lattice, since each atom has 12 neighbors and 12 faces in the Wigner-Seitz cell in the lattice. We compute the total, the smallest, the largest, the mean volume and the mean absolute deviation of the volumes of each atom's Voronoi cell volume segments. We compute the maximum, the minimum, the mean, and the deviation of each of these five atomic features among all the atoms in a given configuration. We describe each configuration by 5×4=20 Voronoi cell volume features. These features are not normalized so that the ML model is trained on the strain-induced changes in the Voronoi cell volumes.

5.6.4 Voronoi Cell Surface Area

In addition, we compute the different statistical parameters of the surface areas of each atom's Voronoi cell segments: the total, the smallest, the largest, the mean surface area, and the mean absolute deviation. We determine the maximum, the minimum, the mean, and the deviation values of the Voronoi cell surface areas in a given configuration. In total, our method describes each configuration by 5×4=20 Voronoi cell surface area features. These features are also not normalized in order to train the ML model on strain-induced changes in the Voronoi cell surface areas.

5.7 Local Ordering Features

Figures 9A, 9B:
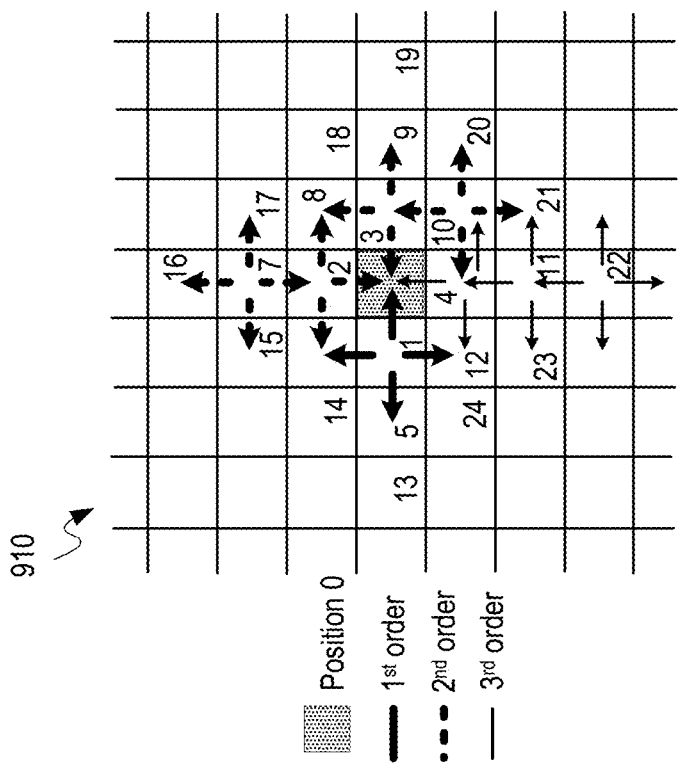
FIG. 9A shows an example crystal graph of a simpler two-dimensional Voronoi lattice.
FIG. 9B shows calculations of the weights for each path shown in FIG. 9A and the sum over the effective weights for atom at the target position of the crystal graph.

We construct the ordering features adopting a slightly modified form of the Warren-Cowley order parameters. These parameters measure the structural order of the environment; to what extent the atomic arrangement in a crystal structure is different from purely-random distributions [47]. Below, we illustrate the procedure to determine the order parameters using the example of a simple lattice. To compute the order parameters, we express the crystal structures by crystal graphs connecting the neighboring atoms. These crystal graphs encode both atomic information and bonding environment between atoms [44-46]. FIG. 9A shows a representative crystal graph 910 of a simpler two-dimensional Voronoi lattice. We choose to discuss the simpler arrangement since the complexity of a crystal graph representing a higher dimensional crystal structure will be harder to visualize and therefore, demonstrate the concept. To construct the crystal graph 910, we determine all possible paths originating from neighboring atoms and ending on a target position (position '0' representing atom X) in the structure. FIG. 9A shows only non-backtracking steps with arrows. FIG. 9A shows the different paths connecting atom at the target position with neighboring atoms. The path length of the arrows indicates the order. For example, a path length 2 may be steps: 10→3→0, where 0 indicates the target position. We consider the paths that include neighboring atoms up to order=3 as the computational expense to determine all possible path combinations increases proportionally with the volume of the sphere containing the neighboring atoms, ~order$^3$. The numbers in FIG. 9A are used to represent indices of the nearest neighbors of atom at the target position of the first, second, and third order. These numbers are used only to tag the atoms, and not used directly in the calculation of the features. Therefore, any numbers or symbols would work as long as each position is distinct, and can simply express the paths originating from a neighbor to a target.

We only consider the non-backtracking paths connecting neighboring atoms up to order=3 to determine the ordering features. Each step of these selected paths are assigned with a fractional weight, $W_n$, where n is the index of the face of the Voronoi cell the step intersects. $W_n$ is determined from the ratio between the area of the face being crossed ($A_n$), normal to the direction of the step, and the sum over all the face areas the step could possibly cross, that are part of other non-backtracking paths:

$$W_n = \frac{A_n}{\Sigma_a A_a - \Sigma_b A_b}. \tag{13}$$

Here the two sums in the denominator are over the face areas that intersect all allowed (a) (including $A_n$) and backtracking (b) steps, respectively. The effective weight of a path is determined by multiplying the fractional weight of each step. The weight of each path can be understood as the probability of taking a certain path, given the probability of taking each step is proportional to the ratio between the area of the face of the Voronoi cell being crossed and the sum over all possible areas. This results in the sum over the effective weights of all possible paths in a given order crystal graph being equal to 1:

$$\sum_{paths} \prod_{steps}^{order} W_n = \sum_{paths} \prod_{steps}^{order} \frac{A_n}{\Sigma_a A_a - \Sigma_b A_b} = 1. \tag{14}$$

If the total number of atoms in a configuration is N, then we have $$\sum_X Q_X = \sum_X \sum_{paths} \prod_{steps}^{order} W_n = N \tag{15}$$

FIG. 9B shows an example calculation of the weights for each path shown in FIG. 9A and the sum over the effective weights for atom at the target position. For the example shown in FIG. 9A, we obtain 4 paths connecting atom at the target position with order=1 neighbors, each with weight $W_n=¼$. There are 12 two-step paths each with weight $W_n=¼×⅓$ connecting with order=2 neighbors. And there are 36 paths for order=3 neighbors, each with weight $W_n=¼×⅓×⅓$. The sum over the effective path weights for any given order is equal to 1.

We further define a species-aware order parameter for atom X as follows:

$$Q_X^{order} = \sum_{paths} \prod_{steps}^{order} \frac{A_n \delta_{nX}}{\Sigma_a A_a - \Sigma_b A_b}. \tag{16}$$

Figure 10B:
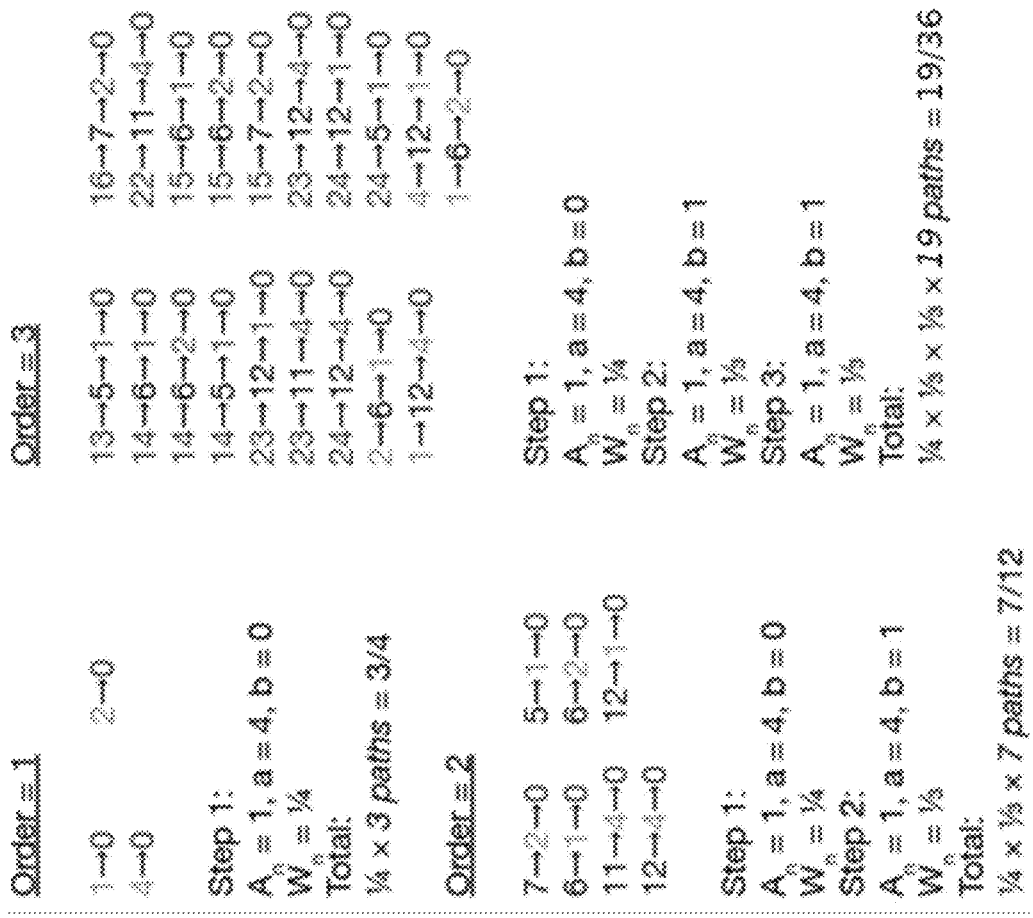
FIG. 10B shows calculations of effective weights to determine the species-aware order parameters of the crystal graph of FIG. 10A.
Figure 10A:
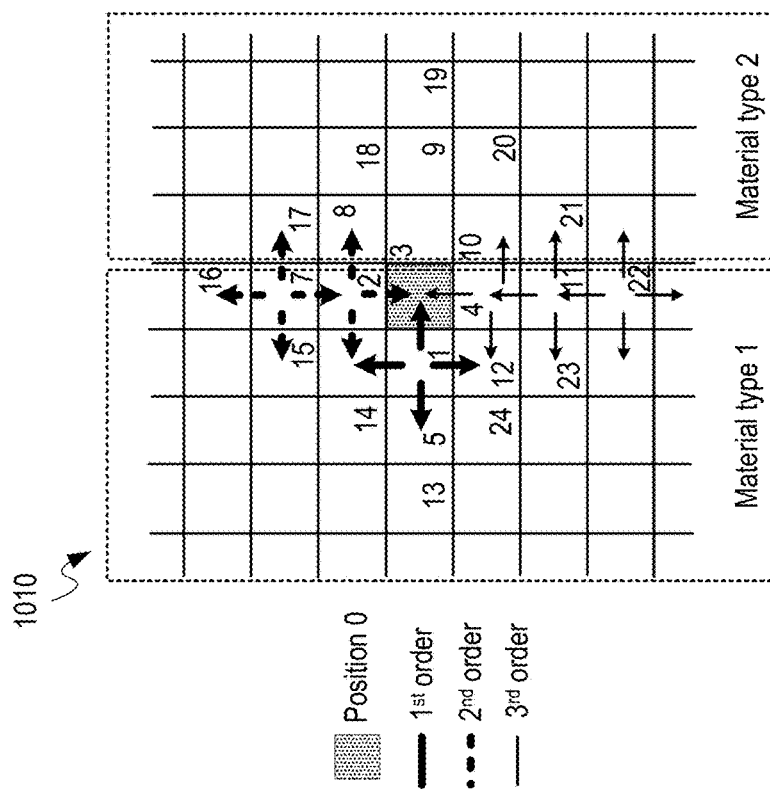
FIG. 10A shows an example crystal graph that illustrates species-aware order parameters.

The Kronecker delta function in the numerator restricts consideration of paths connecting only atoms of same type as X. FIG. 10A shows an example crystal graph 1010 that illustrate species-aware order parameters. Crystal graph 1010 includes an atom at a target position (position '0' representing atom X) with neighboring atoms, within a square Voronoi lattice of a system consisting of two materials forming an interface. FIG. 10B shows calculation of the effective weights $$\left( W_n = \frac{A_n \delta_{nX}}{\Sigma_a A_a - \Sigma_b A_b} \right)$$

to determine species-aware order parameters, $Q_X^{order}$, shown in Eqn. 16. For the example shown in FIG. 10A, we obtain 3 paths connecting the order=1 neighbors, each with weight $W_n=¼$. There are 7 paths each with weight $W_n=¼×⅓$ connecting atom at the target position with order=2 neighbors. And there are 19 paths for order=3 neighbors, each with weight $W_n=¼×⅓×⅓$. The resulting $W_n$'s are used to calculate the species-aware order parameters, $Q_X^{order}$. If a species-aware restriction is applied in the denominator, the resulting order parameter values become unbounded (>1). And, their sum is system size dependent, adding up to ~N, the total number of atoms in the system. Thus, we do not impose any restriction on the denominator, to keep the order parameter definitions unrelated to the system size.

To represent the anisotropy in the bonding environment of a superlattice uniquely, we define a species-aware, directionally-biased order parameter for atom X as follows:

$$Q_X^{\Omega,order} = \sum_{paths} \prod_{steps}^{order} \frac{\vec{\omega}_n A_n \delta_{nX}}{\sum_a \vec{\omega}_a A_a - \sum_b \vec{\omega}_b A_b}. \tag{17}$$

The bias is implemented by considering only the projections of the face area $A_n$, that is being crossed by the step, along a chosen direction. We thus decompose the effective weights of each step along the graph into (x, y, z) components, and include only the specific component representing the chosen direction to calculate the order parameters. $\Omega(\vec{\omega})$ represents an imposed bias that allows contributions from a chosen direction, marked by the vector $\vec{\omega}=(\omega_x, \omega_y, \omega_z)$, where $\omega_x$, $\omega_y$, $\omega_z$ are the projections of $A_n$ onto the corresponding Cartesian directions, (x, y, z), respectively. The choice of $\vec{\omega}$ is not unique, any function of the interatomic distances could be chosen as the bias. The specific functional form of co we chose is given by: $\omega_x=\cos^2\phi \sin^2\theta$, $\omega_y=\sin^2\phi \sin^2\theta$, $\omega_z=\cos^2\theta$, where $\theta$ and $\phi$ are the polar and azimuthal angles of the interatomic distance vector $\vec{d_n}$ makes with the Cartesian axes, as shown in FIG. 2C. The functional form of $\vec{\omega}$ was selected because the sum of the components of $\vec{\omega}$ is equal to 1. For a specific choice of direction, i=(x, y, z), the order parameter is given by $$Q_X^{i,order} = \sum_{paths}\prod_{steps}^{order} \frac{\omega_{i,n}A_n\delta_{nX}}{\Sigma_a\omega_{i,a}A_a - \omega_{i,b}A_b}, \quad (18)$$

where $$\vec{\omega}_m=(\omega_{x,m},\omega_{y,m},\omega_{z,m})=(\cos^2\phi_m \sin^2\theta_m, \sin^2\phi_m \sin^2\theta_m, \cos^2\theta_m). \quad (19)$$

The order parameter feature $Q_X^{\Omega,order}$ particularly important since directional ordering has been predicted to control the atomic orbital contributions to energy bands in Si/Ge heterostructures [78]. The bias in the denominator reflects the idea of conditional probability and results in values that are bounded [0,1]. Without the bias, the order parameter values are not bounded.

Figure 11:
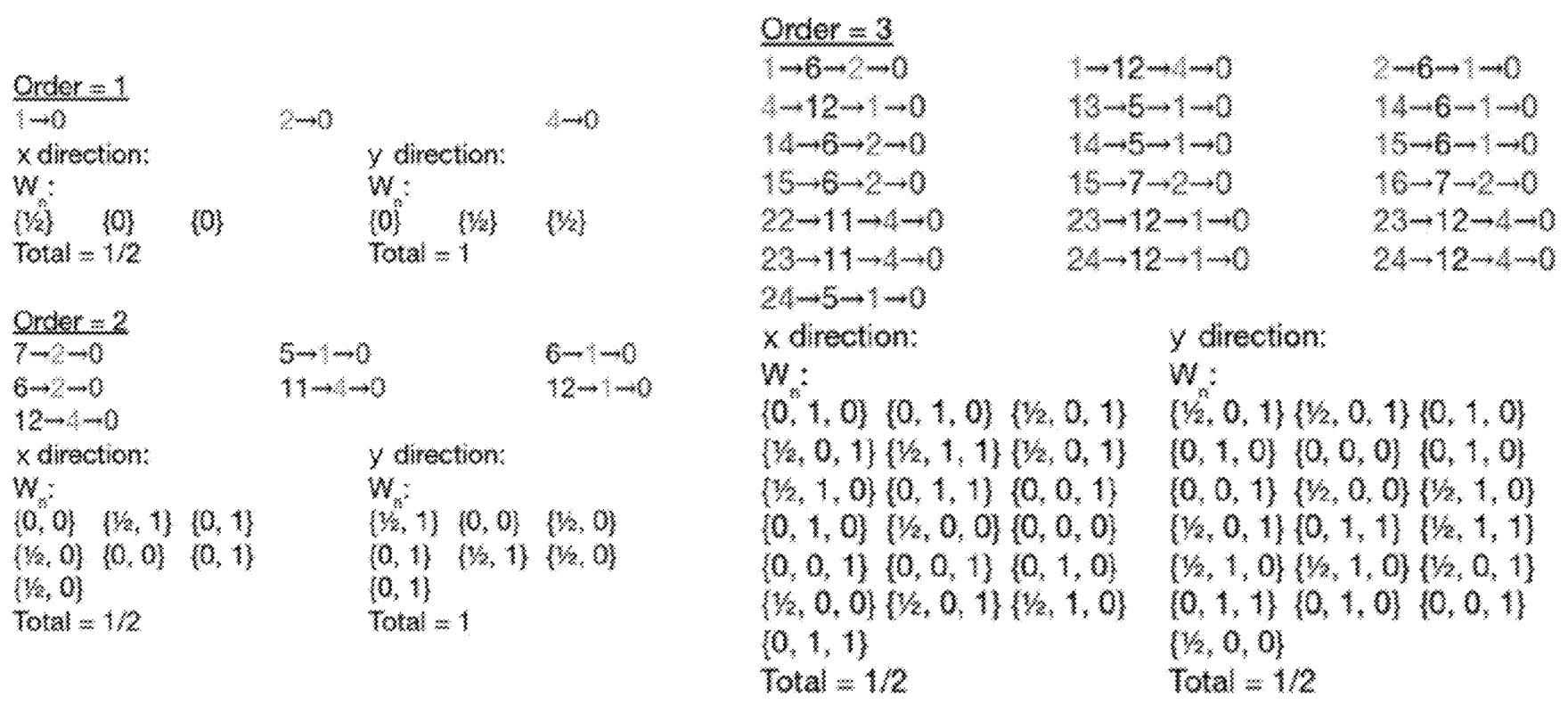

The effective weights shown in FIG. 10B do not consider any imposed directional bias. If the directional bias is applied the weights would be considered separately for horizontal and vertical directions. We demonstrate the concept of the species-aware and directionally-biased order parameters in FIG. 10A using an illustrative example of a graph connecting atom at position '0' (representing X) with neighboring atoms, within a square Voronoi lattice including an interface between two materials. Only paths connecting atom 0 with other type 1 atoms are chosen, to determine species-aware order parameters. The arrows represent non-backtracking paths of lengths 1, 2, and 3. Directionality of the paths follows parallel or perpendicular to the interface. Only non-backtracking steps are shown with the arrows. FIG. 11 shows an example calculation of the effective weights $$\left(W_n^i = \frac{\omega_{i,n}A_n\delta_{nX}}{\Sigma_a\omega_{i,a}A_a - \Sigma_b\omega_{i,b}A_b}, i = x, y\right)$$

to determine the species-aware and directionally-biased order parameters, $Q_X^{i,order}$ shown in Eqn. 18. For the example shown in FIG. 10A, we obtain 3 paths connecting the order=1 neighbors to atom '0', each with effective weight $W_n^i=\frac{1}{2}$. The directional aspect is reflected by the fact that only $W_n^x \neq 0$ for the path $1\rightarrow 0$ and $W_n^y \neq 0$ for the paths $2\rightarrow 0$ and $4\rightarrow 0$. There are 7 paths connecting order=2 neighbors with atom at '0' with only non-zero weights $W_n^x=\frac{1}{2}\times 1$ for the $5\rightarrow 1\rightarrow 0$ path and $W_n^y=\frac{1}{2}\times 1$ for the $7\rightarrow 2\rightarrow 0$ and $11\rightarrow 4\rightarrow 0$ paths. There are 19 paths for order=3 neighbors, with only non-zero weights $W_n^x=\frac{1}{2}\times 1\times 1$ for $13\rightarrow 5\rightarrow 1\rightarrow 0$ and $W_n^y=\frac{1}{2}\times 1\times 1$ for $16\rightarrow 7\rightarrow 2\rightarrow 0$. The resulting $W_n^i$'s are used to calculate the order parameters, $Q_X^{x,order}$ and $Q_X^{y,order}$. For examples, for $W_n=\frac{1}{2}$, there is a 50% chance of a step to be towards the target, and for $W_n=1$ without the backtracking step, there is a 100% chance to step towards the target.

Figure 12C:
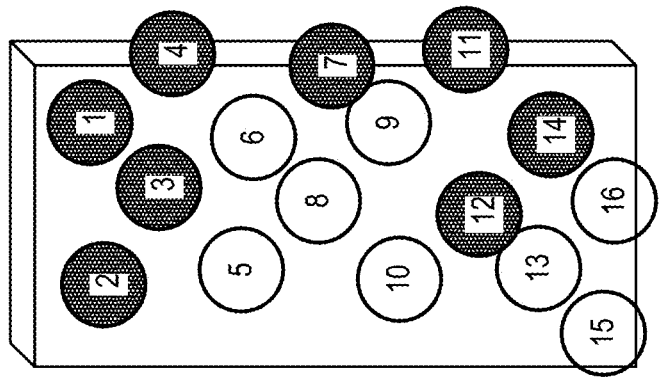
FIGS. 12A, 12B, and 12C show example configurations to demonstrate the order parameter concept for $Si_4Ge_4$ SL, $Si_7Ge_1$ SL, and $Si_8Ge_8$ random alloy, respectively.
Figure 12B:
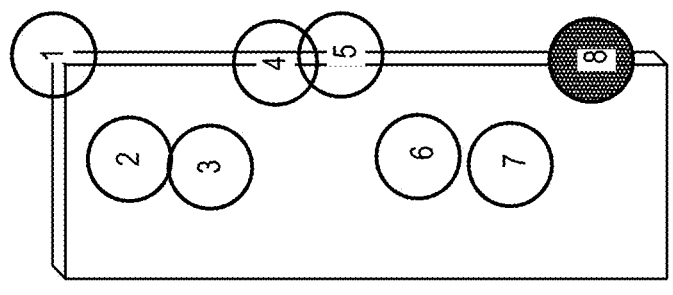
Figure 12A:
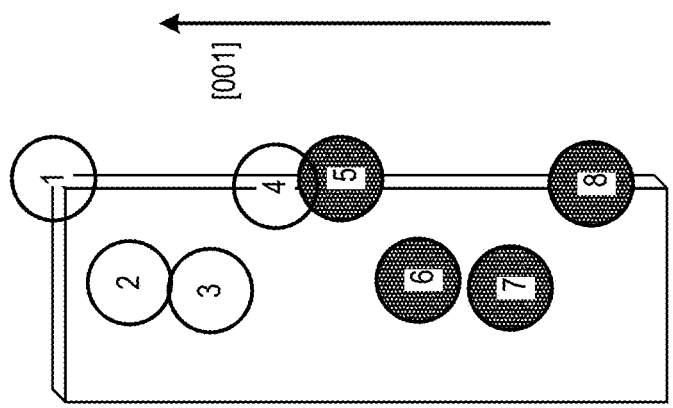

FIGS. 12A, 12B, and 12C show example configurations to demonstrate the order parameter concept for $Si_4Ge_4$ SL, $Si_7Ge_1$ SL, and $Si_8Ge_8$ random alloy, respectively. Table 3 below lists calculated species-aware and directionally-biased order parameters for the $Si_4Ge_4$ SL configuration shown in FIG. 12A. The corresponding atom numbers (column 2) are shown as labels in FIG. 12A. We note that the order parameter values are higher for the inner atoms and lower for the interface atoms. This is due to the presence of greater number of same species neighboring atoms for the inner atoms, resulting in higher number of connecting paths contributing to the order parameters. For comparison, all the listed order parameters are equal to 1 for the bulk systems. The order parameters in the x and the y directions are equal, due to the symmetry of the configuration. The order parameter values decrease for higher order neighbors, as expected. Ordering in the z direction is lower and decreases faster with the order number than the ordering in the x and y directions. This reflects the orientation of the heterogeneous stacking along the z direction.

TABLE 3

| Atom | # | $Q^{x,1}$ | $Q^{y,1}$ | $Q^{z,1}$ | $Q^{x,2}$ | $Q^{y,2}$ | $Q^{z,2}$ | $Q^{x,3}$ | $Q^{y,3}$ | $Q^{z,3}$ |
|---|---|---|---|---|---|---|---|---|---|---|
| Si | 1 | 0.55 | 0.55 | 0.51 | 0.49 | 0.49 | 0.45 | 0.36 | 0.36 | 0.29 |
| Si | 2 | 0.95 | 0.95 | 0.89 | 0.64 | 0.64 | 0.53 | 0.43 | 0.43 | 0.34 |
| Si | 3 | 0.95 | 0.95 | 0.89 | 0.64 | 0.64 | 0.53 | 0.43 | 0.43 | 0.34 |
| Si | 4 | 0.55 | 0.55 | 0.51 | 0.49 | 0.49 | 0.45 | 0.36 | 0.36 | 0.29 |
| Ge | 5 | 0.53 | 0.53 | 0.49 | 0.47 | 0.47 | 0.46 | 0.37 | 0.37 | 0.30 |
| Ge | 6 | 0.97 | 0.97 | 0.94 | 0.70 | 0.70 | 0.58 | 0.47 | 0.47 | 0.36 |
| Ge | 7 | 0.97 | 0.97 | 0.94 | 0.70 | 0.70 | 0.58 | 0.47 | 0.47 | 0.36 |
| Ge | 8 | 0.53 | 0.53 | 0.49 | 0.47 | 0.47 | 0.46 | 0.37 | 0.37 | 0.30 |

The calculated order parameters for the $Si_7Ge_1$ SL depicted in FIG. 12B are shown in Table 4 below. Similar observations can be made that the ordering is higher for the inner atoms and lower for the interface atoms. The order parameter values are particularly low for the Ge atom since the Ge region is only 1 monolayer thick. The thinner the layer the smaller the $Q^{z,order}$, due to the reduced number of same-species neighbors and as a result, availability of fewer connecting paths. We can identify four unique atomic environments along the z direction: interface Si, interface Ge, inner Si, and inner Ge. For example, considering FIGS. 12A and 12B and the corresponding Tables 3 and 4, we can classify that the interface atoms are characterized by $Q^{z,1}$~0.5-0.6 and the inner atoms have $Q^{z,1}$~0.9-1.0. The size of these regions distinguishes different configurations. For example, in the $Si_4Ge_4$ configuration, we can identify the following regions: interface Si (1,4); inner Si (2,3); interface Ge (5,8); inner Ge (6,7). The boundaries between different regions become clearer with increasing systems size.

TABLE 4

| Atom | # | $Q^{x,1}$ | $Q^{y,1}$ | $Q^{z,1}$ | $Q^{x,2}$ | $Q^{y,2}$ | $Q^{z,2}$ | $Q^{x,3}$ | $Q^{y,3}$ | $Q^{z,3}$ |
|---|---|---|---|---|---|---|---|---|---|---|
| Si | 1 | 0.60 | 0.60 | 0.58 | 0.53 | 0.53 | 0.52 | 0.45 | 0.45 | 0.43 |
| Si | 2 | 0.96 | 0.96 | 0.90 | 0.73 | 0.73 | 0.67 | 0.65 | 0.65 | 0.60 |
| Si | 3 | 1.00 | 1.00 | 1.00 | 0.96 | 0.96 | 0.91 | 0.80 | 0.80 | 0.74 |
| Si | 4 | 1.00 | 1.00 | 1.00 | 0.99 | 0.99 | 0.98 | 0.90 | 0.90 | 0.82 |
| Si | 5 | 1.00 | 1.00 | 1.00 | 0.96 | 0.96 | 0.91 | 0.80 | 0.80 | 0.74 |
| Si | 6 | 0.96 | 0.96 | 0.90 | 0.73 | 0.73 | 0.67 | 0.65 | 0.65 | 0.60 |
| Si | 7 | 0.60 | 0.60 | 0.58 | 0.53 | 0.53 | 0.52 | 0.45 | 0.45 | 0.43 |
| Ge | 8 | 0.11 | 0.11 | 0.00 | 0.01 | 0.01 | 0.00 | 0.00 | 0.00 | 0.00 |

In Table 5 below, we show the calculated species aware and directionally biased order parameters for the $Si_8Ge_8$ random alloy configuration shown in FIG. 12C. Unlike the SL configurations, the order parameters do not show any specific pattern and decrease fast with the order number reflecting the disordered nature of the system.

TABLE 5

| Atom | # | $Q^{x,1}$ | $Q^{y,1}$ | $Q^{z,1}$ | $Q^{x,2}$ | $Q^{y,2}$ | $Q^{z,2}$ | $Q^{x,3}$ | $Q^{y,3}$ | $Q^{z,3}$ |
|---|---|---|---|---|---|---|---|---|---|---|
| Ge | 1 | 0.50 | 0.55 | 0.48 | 0.21 | 0.21 | 0.15 | 0.09 | 0.08 | 0.05 |
| Ge | 2 | 0.55 | 0.50 | 0.48 | 0.23 | 0.21 | 0.17 | 0.08 | 0.08 | 0.04 |
| Ge | 3 | 0.55 | 0.50 | 0.48 | 0.21 | 0.21 | 0.15 | 0.08 | 0.09 | 0.05 |
| Ge | 4 | 0.50 | 0.55 | 0.48 | 0.21 | 0.23 | 0.17 | 0.08 | 0.08 | 0.04 |
| Si | 5 | 0.34 | 0.34 | 0.30 | 0.22 | 0.22 | 0.20 | 0.05 | 0.05 | 0.04 |
| Si | 6 | 0.34 | 0.34 | 0.30 | 0.21 | 0.21 | 0.20 | 0.05 | 0.05 | 0.04 |
| Ge | 7 | 0.10 | 0.10 | 0.19 | 0.05 | 0.05 | 0.08 | 0.02 | 0.02 | 0.03 |
| Si | 8 | 0.83 | 0.83 | 0.83 | 0.11 | 0.11 | 0.09 | 0.03 | 0.03 | 0.03 |
| Si | 9 | 0.34 | 0.37 | 0.34 | 0.22 | 0.23 | 0.22 | 0.05 | 0.05 | 0.03 |
| Si | 10 | 0.37 | 0.34 | 0.34 | 0.23 | 0.22 | 0.22 | 0.05 | 0.05 | 0.03 |
| Ge | 11 | 0.34 | 0.29 | 0.26 | 0.09 | 0.10 | 0.08 | 0.02 | 0.02 | 0.02 |
| Ge | 12 | 0.29 | 0.34 | 0.26 | 0.10 | 0.09 | 0.08 | 0.02 | 0.02 | 0.02 |
| Si | 13 | 0.45 | 0.45 | 0.49 | 0.05 | 0.05 | 0.03 | 0.02 | 0.02 | 0.02 |
| Ge | 14 | 0.46 | 0.46 | 0.51 | 0.08 | 0.08 | 0.08 | 0.03 | 0.03 | 0.02 |
| Si | 15 | 0.30 | 0.30 | 0.21 | 0.09 | 0.09 | 0.07 | 0.01 | 0.01 | 0.01 |
| Si | 16 | 0.30 | 0.30 | 0.21 | 0.09 | 0.09 | 0.07 | 0.01 | 0.01 | 0.01 |

We compute the mean, mean absolute deviation, maximum, and minimum of the order parameter distributions in a configuration to create the ordering features. In total, our method describes each configuration by 36 order parameter features: (3 orders)×(3 directional bias)×(4 statistical features).

5.8 Feature Importance

Figure 13A:
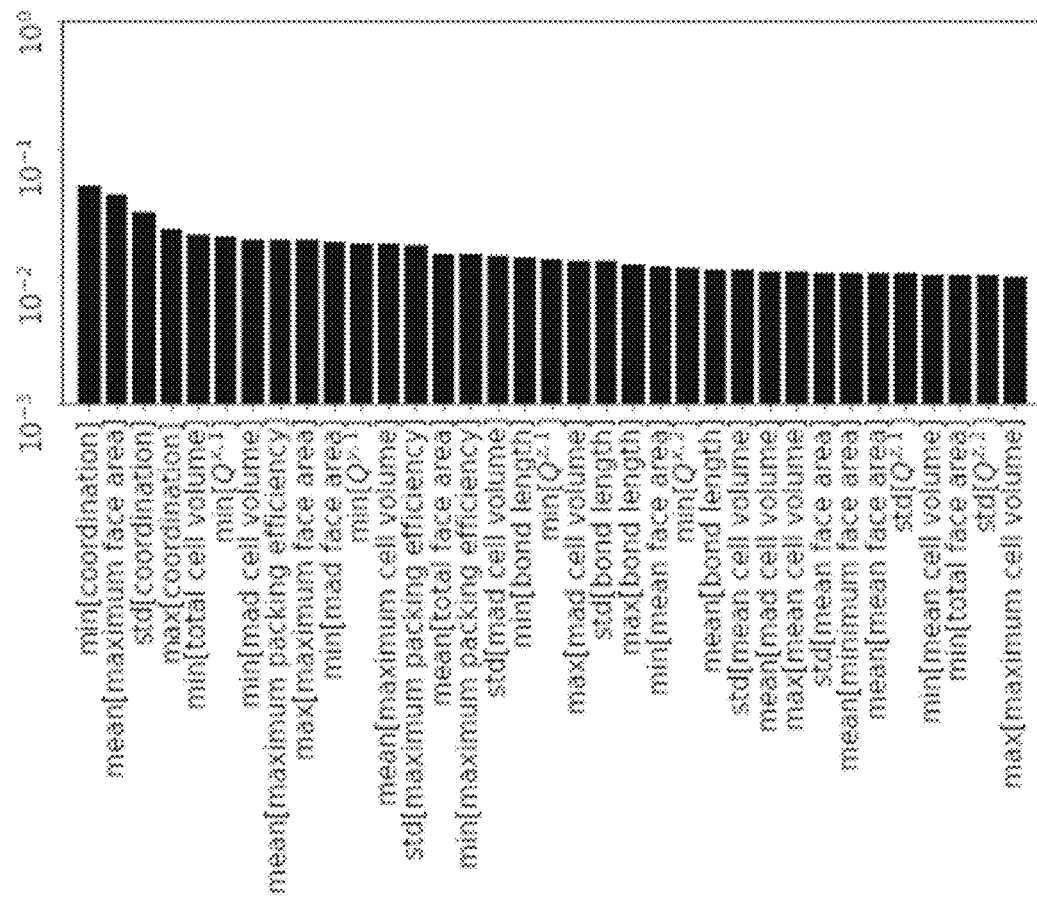
FIGS. 13A, 13B, 13C, and 13D show the relative importance of 35 features of the training structures with the most impact on the outcomes of the random forest algorithm for: strained superlattice units, relaxed superlattice units, disordered units, and relaxed disordered and ordered superlattice units, respectively.
Figure 13B:
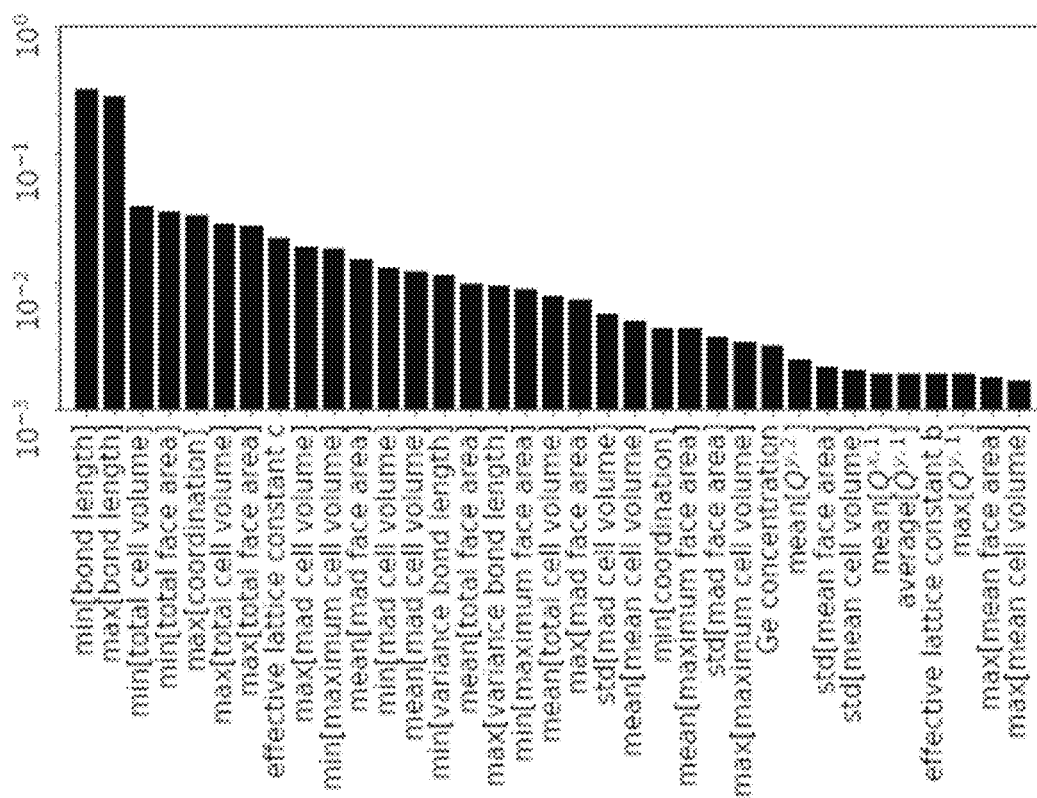
Figure 13D:
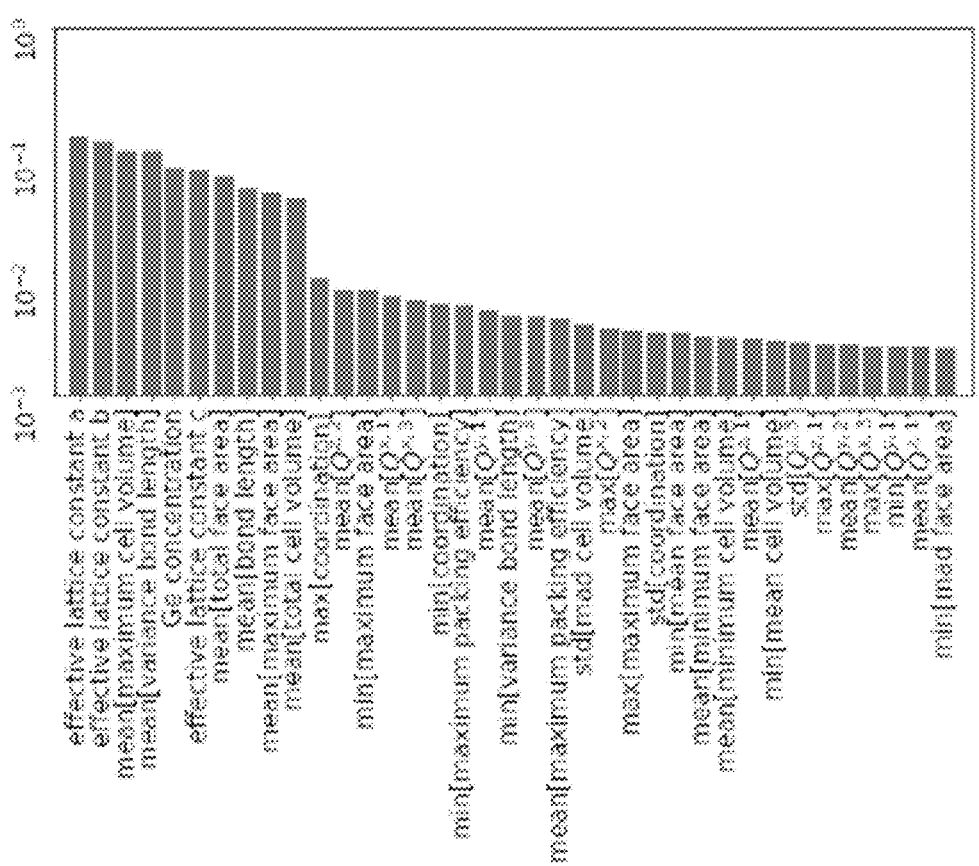
Figure 13C:
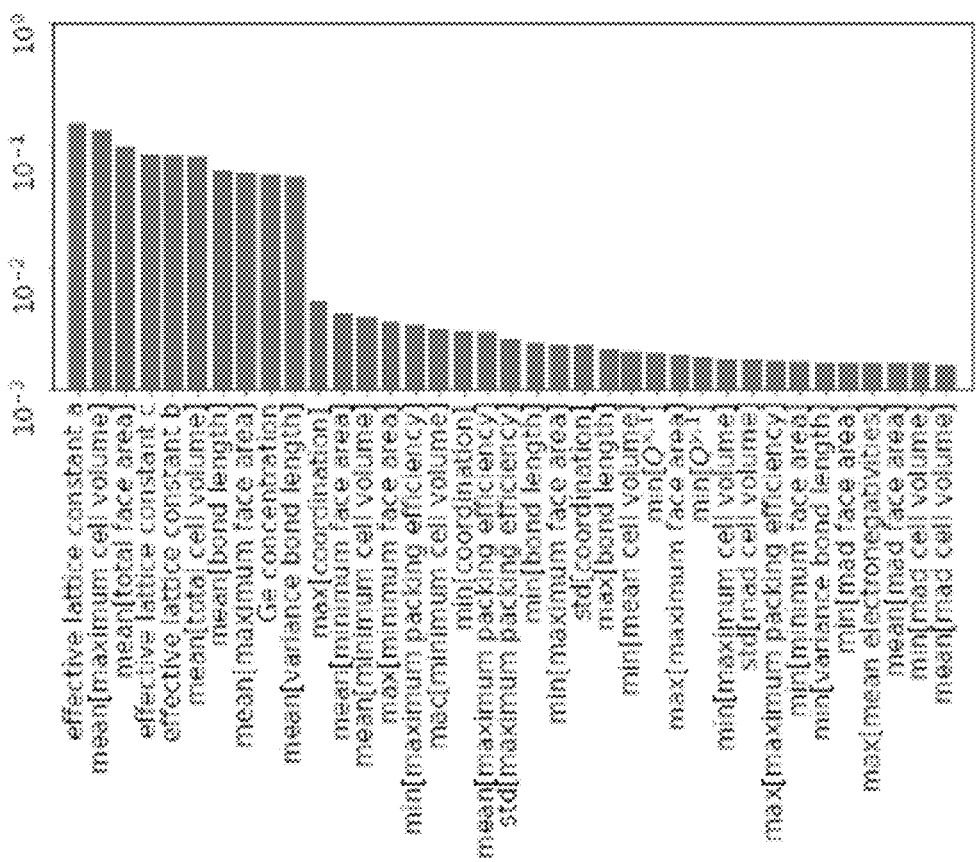

FIGS. 13A, 13B, 13C, and 13D show the relative importance of 35 features of the training structures with the most impact on the outcomes of the RF algorithm for: strained superlattice units, relaxed superlattice units, disordered units, and relaxed disordered and ordered superlattice units, respectively. The total importance factor of all 100 features is 1. In FIG. 13A, the strain related features gain higher importance than the order parameters for strained ordered units. However, for FIGS. 13B, 13C, and 13D, the order parameters become important when the disordered and ordered units are combined, because they capture the intrinsic symmetry of the units. For example, in FIG. 13A, the first order parameter $Q_x^{y,2}$ is at the $27^{th}$ place among 100 total features for SL units, while in FIG. 13D, the second order parameter, $Q_x^{z,2}$, is at the $12^{th}$ place among 100 total features for the relaxed disordered and ordered units. Considering the trend, we anticipate that the order parameter features would become more important for the electronic properties of complex structures that include a combination of alloy and heterogeneous regions or large random alloy configurations.

5.9 Seebeck Calculation

Figure 14:
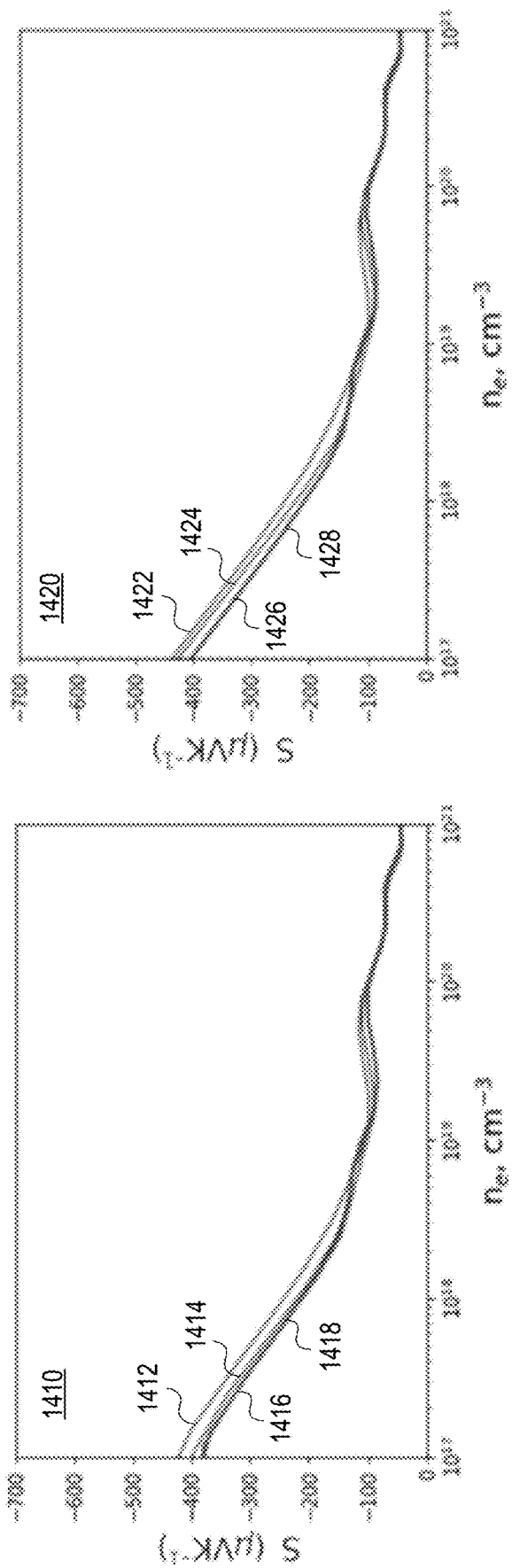
FIG. 14 shows thermopower plots that illustrate thermopower convergence for $Si_{16}Ge_{16}$ relaxed random alloy with increasing k-point mesh.

FIG. 14 shows thermopower plots 1410 and 1420 that illustrate thermopower convergence for $Si_{16}Ge_{16}$ relaxed random alloy with increasing k-point mesh. We chose a F-centered 21×21×21 Monkhorst-Pack k-point mesh for the production calculations We checked the convergence of the calculated thermopower of representative $Si_{16}Ge_{16}$ random alloy with respect to three main parameters: number of k-points, number of bands, and electronic band gap. The effect of increasing k-point mesh on the thermopower without and with band gap correction is shown in plots 1410 and 1420, respectively. In plots, 1410 and 1420, thermopower traces 1416 and 1426 with 21×21×21 k-point mesh are indistinguishable from a thermopower traces 1418 and 1428 with a denser 31×31×31 mesh, therefore we chose a F-centered 21×21×21 Monkhorst-Pack k-point mesh for the production calculations shown above. The plots 1410 and 1420 also include traces 1412 and 1422 for 11×11×11 and traces 1414 and 1424 for 21×21×11 k-point mesh for comparison. The band gap correction affects thermopower values at low ($n_e$~$10^{17}$) carrier concentrations, the contribution from the valence band maximum increases the thermopower, and but is not significant for the higher concentrations.

Figure 15:
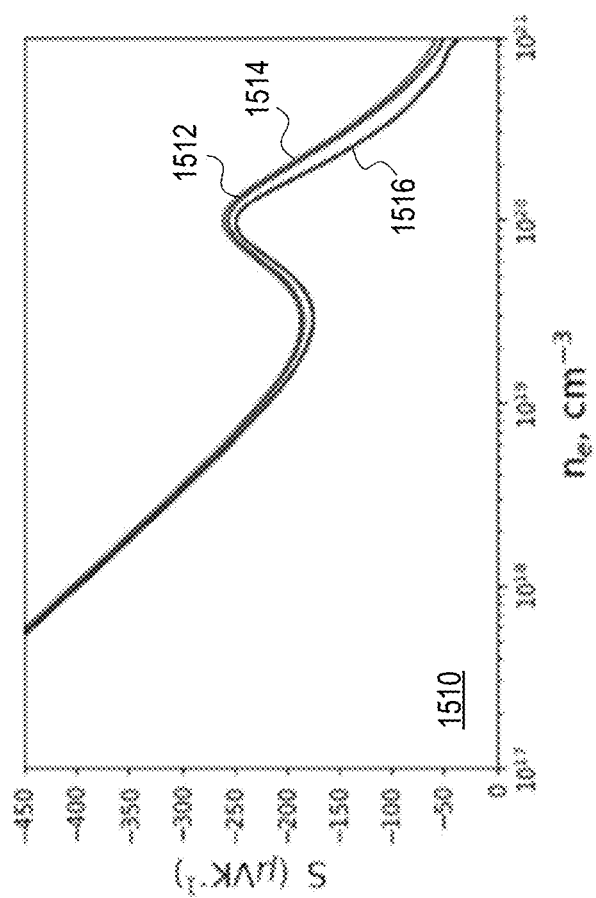
FIG. 15 shows a thermopower plot that illustrates thermopower convergence for $Si_8Ge_8$ relaxed superlattice with increasing the number of conduction bands in the calculation.

FIG. 15 shows a thermopower plot 1510 that illustrates convergence for $Si_8Ge_8$ relaxed SL with increasing the number of conduction bands in the calculation. The thermopower plot 1510 includes traces 1512, 1514, and 1516 that correspond to including 1, 2, and 3 conduction bands, respectively, while keeping the number of valence bands fixed to one. In the results presented in previous sections, we train the ML algorithms to learn 6 conduction and 6 valence bands and include them to compute the Seebeck coefficients. In FIG. 15 we demonstrate the convergence of S by including increasing number of conduction bands in the calculation.

5.10 Non-Ideal Heterostructures

Figure 16:
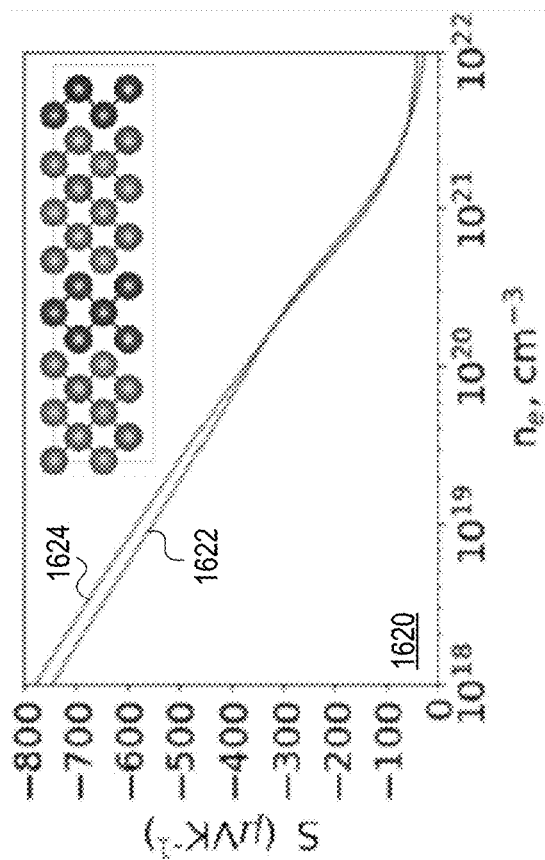
FIG. 16 shows thermopower plots that compare thermopower calculated using DFT and using predicted band structure for two examples of relaxed non-ideal heterostructures.
Figure 16:
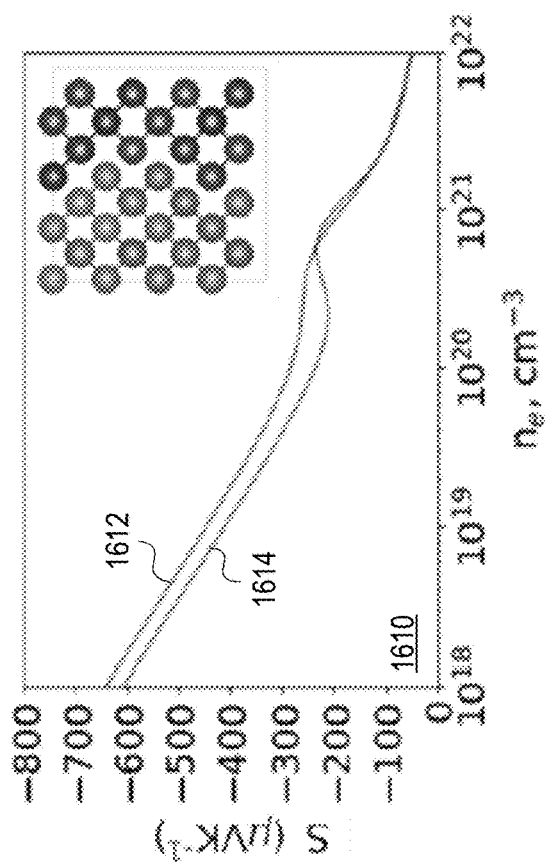

FIG. 16 shows thermopower plots 1610 and 1620 that compare thermopower calculated using DFT and using predicted band structure for $Si_{32}Ge_{32}$ relaxed non-ideal heterostructure and relaxed $Si_5Ge_3Si_6Ge_2$ multilayered structure, respectively. The plots 1610 and 1620 include traces 1612 and 1622 for thermopower calculated using DFT and traces 1614 and 1624 for thermopower calculated from the ML predictions. The prediction is made with RF algorithm trained on relaxed disordered and relaxed unit structures. We tested the ML models on a class of non-ideal heterostructures including the structures shown in FIGS. 5A and 5B. We constructed the test configurations by stacking the SL unit cells with atomic composition $Si_nGe_m$ (16 atoms, 2CCs) along the [001] direction for the plot 1620 and along the [100] direction for the plot 1610, and with uneven repeat units. The resulting stoichiometry of the test configurations may be represented as $Si_nGe_mSi_kGe_l$ with n+m+k+l=32, n≠k, and m≠l. We tested our ML models on all the $2 \times C_2^4$ generated test structures and show only some results representing the systems, for the sake of brevity.

REFERENCES

[1] Alferov, Z. I. Nobel lecture: The double heterostructure concept and its applications in physics, electronics, and technology. *Rev. Mod. Phys.* 73, 767 (2001).

[2] Thompson, S. E. et al. A 90-nm logic technology featuring strained-silicon. *IEEE Trans. Electron Devices* 51, 1790-1797 (2004).

[3] Meyerson, B. S. High-speed silicon-germanium electronics. *Sci. Am.* 270, 62-67 (1994).

[4] Nissim, Y. & Rosencher, E. *Heterostructures on silicon: one step further with silicon*, vol. 160 (Springer Science & Business Media, 2012).

[5] Paul, D. J. Si/SiGe heterostructures: from material and physics to devices and circuits. *Semicond. Sci. Technol.* 19, R75 (2004).

[6] Koester, S. J., Schaub, J. D., Dehlinger, G. & Chu, J. O. Germanium-on-SOI infrared detectors for integrated photonic applications. *IEEE J. Sel. Top. Quantum Electron.* 12, 1489-1502 (2006).

[7] Liu, J., Sun, X., Camacho-Aguilera, R., Kimerling, L. C. & Michel, J. Ge-on-Si laser operating at room temperature. *Opt. Lett.* 35, 679-681 (2010).

[8] Alam, H. & Ramakrishna, S. A review on the enhancement of figure of merit from bulk to nano-thermoelectric materials. *Nano Energy* 2, 190-212 (2013).

[9] Taniguchi, T. et al. High thermoelectric power factor realization in Si-rich SiGe/Si superlattices by super-controlled interfaces. *ACS Appl. Mater. Interfaces* (2020).

[10] Shi, Z. et al. Tunable singlet-triplet splitting in a few-electron Si/SiGe quantum dot. *Appl. Phys. Lett.* 99, 233108 (2011).

[11] Euaruksakul, C. et al. Heteroepitaxial growth on thin sheets and bulk material: Exploring differences in strain relaxation via low-energy electron microscopy. *J. Phys. D: Appl. Phys.* 47, 025305 (2013).

[12] Brehm, M. & Grydlik, M. Site-controlled and advanced epitaxial Ge/Si quantum dots: fabrication, properties, and applications. *Nanotechnology* 28, 392001 (2017).

[13] Lee, C. et al. Interplay of strain and intermixing effects on direct-bandgap optical transition in strained Ge-on-Si under thermal annealing. *Sci. Rep.* 9, 1-9 (2019).

[14] Chen, P. et al. Role of surface-segregation-driven intermixing on the thermal transport through planar Si/Ge superlattices. *Phys. Rev. Lett.* 111, 115901 (2013).

[15] David, T. et al. New strategies for producing defect free SiGe strained nanolayers. *Sci. Rep.* 8, 2891 (2018).

[16] Samarelli, A. et al. The thermoelectric properties of Ge/SiGe modulation doped superlattices. *J. Appl. Phys.* 113, 233704 (2013).

[17] Koga, T., Cronin, S., Dresselhaus, M., Liu, J. & Wang, K. Experimental proof-of-principle investigation of enhanced Z3DT in (001) oriented Si/Ge superlattices. *Appl. Phys. Lett.* 77, 1490-1492 (2000).

[18] Watling, J. R. & Paul, D. J. A study of the impact of dislocations on the thermoelectric properties of quantum wells in the Si/SiGe materials system. *J. Appl. Phys.* 110, 114508 (2011).

[19] Vargiamidis, V. & Neophytou, N. Hierarchical nanostructuring approaches for thermoelectric materials with high power factors. *Phys. Rev. B* 99, 045405 (2019).

[20] Snyder, J. C., Rupp, M., Hansen, K., Müller, K.-R. & Burke, K. Finding density functionals with machine learning. *Phys. Rev. Lett.* 108, 253002 (2012).

[21] Behler, J. Perspective: Machine learning potentials for atomistic simulations. *J. Chem. Phys.* 145, 170901 (2016).

[22] Ramprasad, R., Batra, R., Pilania, G., Mannodi-Kanakkithodi, A. & Kim, C. Machine learning in materials informatics: recent applications and prospects. *npj Comput. Mater.* 3, 1-13 2017).

[23] Ward, L., Agrawal, A., Choudhary, A. & Wolverton, C. A general-purpose machine learning framework for predicting properties of inorganic materials. *npj Comput. Mater.* 2, 1-7 (2016).

[24] Meredig, B. et al. Combinatorial screening for new materials in unconstrained composition space with machine learning. *Phys. Rev. B* 89, 094104 (2014).

[25] Jain, A., Shin, Y. & Persson, K. A. Computational predictions of energy materials using density functional theory. *Nat. Rev. Mater.* 1, 1-13 (2016).

[26] Wang, T., Zhang, C., Snoussi, H. & Zhang, G. Machine learning approaches for thermoelectric materials research. *Adv. Funct. Mater.* 30, 1906041 (2020).

[27] Gaultois, M. W. et al. Perspective: Web-based machine learning models for real-time screening of thermoelectric materials properties. *Apl Mater.* 4, 053213 (2016).

[28] Jain, A. et al. The Materials Project: A materials genome approach to accelerating materials innovation. *APL Mater.* 1, 011002 (2013).

[29] Draxl, C. & Scheffler, M. The NOMAD laboratory: From data sharing to artificial intelligence (2019).

[30] Gaultois, M. W. et al. Data-driven review of thermoelectric materials: performance and resource considerations. *Chem. Mater.* 25, 2911-2920 (2013).

[31] Schleder, G. R., Padilha, A. C., Acosta, C. M., Costa, M. & Fazzio, A. From dft to machine learning: recent approaches to materials science—a review. *J. Phys. Mater.* 2, 032001 (2019).

[32] Xie, T., France-Lanord, A., Wang, Y., Shao-Horn, Y. & Grossman, J. C. Graph dynamical networks for unsupervised learning of atomic scale dynamics in materials. *Nat. Commun.* 10, 1-9 (2019).

[33] Nye, J. F. et al. *Physical properties of crystals: their representation by tensors and matrices* (Oxford university press, 1985).

[34] Proshchenko, V. S., Settipalli, M. & Neogi, S. Optimization of seebeck coefficients of strainsymmetrized semiconductor heterostructures. *Appl. Phys. Lett.* 115, 211602 (2019).

[35] Proshchenko, V. S., Settipalli, M., Pimachev, A. K. & Neogi, S. Role of substrate strain to tune energy bands—seebeck relationship in semiconductor heterostructures. *J. Appl. Phys.* 129, 025301 (2021).

[36] Settipalli, M. & Neogi, S. Theoretical prediction of enhanced thermopower in n-doped si/ge superlattices using effective mass approximation. *J. Electron. Mater.* 49, 4431-4442 (2020).

[37] Hinsche, N., Mertig, I. & Zahn, P. Thermoelectric transport in strained Si and Si/Ge heterostructures. *J. Phys.: Condens. Matter* 24, 275501 (2012).

[38] Peter, Y. & Cardona, M. *Fundamentals of semiconductors: physics and materials properties* (Springer Science & Business Media, 2010).

[39] Ridley, B. *Quantum Processes in Semiconductors* (Oxford Univ. Press, 1999).

[40] Schäffler, F. High-mobility Si and Ge structures. *Semicond. Sci. Technol.* 12, 1515 (1997).

[41] Proshchenko, V. S., Dholabhai, P. P., Sterling, T. C. & Neogi, S. Heat and charge transport in bulk semiconductors with interstitial defects. *Phys. Rev. B* 99, 014207 (2019).

[42] Ward, L. et al. Including crystal structure attributes in machine learning models of formation energies via voronoi tessellations. *Phys. Rev. B* 96, 024104 (2017).

[43] Ghiringhelli, L. M., Vybiral, J., Levchenko, S. V., Draxl, C. & Scheffler, M. Big data of materials science: critical role of the descriptor. *Phys. Rev. Lett.* 114, 105503 (2015).

[44] Xie, T. & Grossman, J. C. Crystal graph convolutional neural networks for an accurate and interpretable prediction of material properties. *Phys. Rev. Lett.* 120, 145301 (2018).

[45] Xie, T. & Grossman, J. C. Hierarchical visualization of materials space with graph convolutional neural networks. *J. Chem. Phys.* 149, 174111 (2018).

[46] Gong, S. et al. Predicting charge density distribution of materials using a local-environment based graph convolutional network. *Phys. Rev. B* 100, 184103 (2019).

[47] Cowley, J. An approximate theory of order in alloys. *Phys. Rev.* 77, 669 (1950).

[48] Wen, C.-Y., Reuter, M. C., Su, D., Stach, E. A. & Ross, F. M. Strain and stability of ultrathin Ge layers in Si/Ge/Si axial heterojunction nanowires. *Nano Lett.* 15, 1654-1659 (2015).

[49] Gupta, G., Rajasekharan, B. & Hueting, R. J. Electrostatic doping in semiconductor devices. *IEEE Trans. Electron Devices* 64, 3044-3055 (2017).

[50] Mahan, G. & Sofo, J. O. The best thermoelectric. *Proc. Natl. Acad. Sci.* 93, 7436-7439 (1996).

[51] Popescu, V. & Zunger, A. Extracting E versus $\vec{k}$ effective band structure from supercell calculations on alloys and impurities. *Phys. Rev. B* 85, 085201 (2012).

[52] Boykin, T. B., Kharche, N., Klimeck, G. & Korkusinski, M. Approximate bandstructures of semiconductor alloys from tight-binding supercell calculations. *J. Phys.: Condens. Matter* 19, 036203 (2007).

[53] Yang, B., Liu, J., Wang, K. & Chen, G. Characterization of cross-plane thermoelectric properties of Si/Ge superlattices. In *Proceedings ICT2001. 20 International Conference on Thermoelectrics* (Cat. No. 01TH8589), 344-347 (IEEE, 2001).

[54] Dismukes, J., Ekstrom, L., Steigmeier, E., Kudman, I. & Beers, D. Thermal and electrical properties of heavily doped Ge—Si alloys up to 1300 K. *J. Appl. Phys.* 35, 2899-2907 (1964).

[55] Zhang, Y. et al. Measurement of seebeck coefficient perpendicular to SiGe superlattice. In *Thermoelectrics, 2002. Proceedings ICT'02. Twenty-First International Conference on,* 329-332 (IEEE, 2002).

[56] Pearsall, T. P. *Strained-Layer Superlattices: Materials Science and Technology*, vol. 33 (Academic Press, 1991).

[57] Manasreh, M. O., Pantelides, S. T. & Zollner, S. *Optoelectronic Properties of Semiconductors and Superlattices*, vol. 15 (Taylor & Francis Books, INC, 1991).

[58] Van deWalle, C. G. & Martin, R. M. Theoretical calculations of heterojunction discontinuities in the Si/Ge system. *Phys. Rev. B* 34, 5621 (1986).

[59] Kresse, G. & Furthmuller, J. Efficiency of ab-initio total energy calculations for metals and semiconductors using a plane-wave basis set. *Comput. Mater. Sci* 6, 15-50 (1996).

[60] Kresse, G. & Furthmuller, J. Efficient iterative schemes for ab initio total-energy calculations using a plane-wave basis set. *Phys. Rev. B* 54, 11169 (1996).

[61] Perdew, J. P., Burke, K. & Ernzerhof, M. Generalized gradient approximation made simple. *Phys. Rev. Lett.* 77, 3865 (1996).

[62] Kresse, G. & Joubert, D. From ultrasoft pseudopotentials to the projector augmented-wave method. *Phys. Rev. B* 59, 1758 (1999).

[63] Blöchl, P. E. Projector augmented-wave method. *Phys. Rev. B* 50, 17953 (1994).

[64] Hybertsen, M. S. & Schluter, M. Theory of optical transitions in Si/Ge (001) strained-layer superlattices. *Phys. Rev. B* 36, 9683 (1987).

[65] Monkhorst, H. J. & Pack, J. D. Special points for brillouin-zone integrations. *Phys. Rev. B* 13, 5188 (1976).

[66] Ziman, J. M. *Electrons and phonons: the theory of transport phenomena in solids* (Oxford university press, 1960).

[67] Madsen, G. K. & Singh, D. J. BoltzTraP. a code for calculating band-structure dependent quantities. *Comput. Phys. Commun.* 175, 67-71 (2006).

[68] Chollet, F. et al. Keras (Internet) (GitHub, 2015). URL https://github.com/fchollet/keras.

[69] Breiman, L. Random forests. *Mach. Learn.* 45, 5-32 (2001).

[70] Pedregosa, F. et al. Scikit-learn: Machine learning in python. *J. Mach. Learn. Res.* 12, 2825-2830 (2011).

[71] Wang, L.-W., Bellaiche, L., Wei, S.-H. & Zunger, A. "majority representation" of alloy electronic states. *Phys. Rev. Lett.* 80, 4725 (1998).

[72] Perdew, J. P. et al. Understanding band gaps of solids in generalized kohn-sham theory. *Proc. Natl. Acad. Sci.* 114, 2801-2806 (2017).

[73] Morales-Garcia, Á., Valero, R. & Illas, F. An empirical, yet practical way to predict the band gap in solids by using density functional band structure calculations. *J. Phys. Chem. C* 121, 18862-18866 (2017).

[74] Hummer, K., Harl, J. & Kresse, G. Heyd-scuseria-ernzerhof hybrid functional for calculating the lattice dynamics of semiconductors. *Phys. Rev. B* 80, 115205 (2009).

[75] Heyd, J., Scuseria, G. E. & Ernzerhof, M. Hybrid functionals based on a screened coulomb potential. *J. Chem. Phys.* 118, 8207-8215 (2003).

[76] Dziekan, T., Zahn, P., Meded, V. & Mirbt, S. Theoretical calculations of mobility enhancement in strained silicon. *Phys. Rev. B* 75, 195213 (2007).

[77] Cuantam lab-github page. https://github.com/CUANTAM.

[78] Proshchenko, V., Settipalli, M., Pimachev, A. K., Neogi, S. et al. Modulation of semiconductor superlattice thermopower through symmetry and strain. arXiv: 1907.03461 (2019).

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A method for determining electronic band structure, comprising:
    partitioning, based on a location of each of a plurality of atoms forming a crystalline structure, a volume of the crystalline structure to obtain Voronoi tessellations;
    constructing, based on the Voronoi tessellations, a plurality of crystal graphs;
    deriving, based on the plurality of crystal graphs, a plurality of directional order parameters of the crystalline structure, each of the plurality of directional order parameters being biased along one of a plurality of spatial directions of the crystalline structure;
    feeding, into a trained machine-learning model, the plurality of directional order parameters, one or more global structural features of the crystalline structure, and one or more species-based features of the crystalline structure;
    receiving, in response to said feeding, a plurality of energy values outputted by the trained machine-learning model, the plurality of energy values sampling a Brillouin zone of the crystalline structure; and
    fabricating a sample based on the plurality of energy values.

2. The method of claim 1, the plurality of spatial directions comprising a first direction, a second direction, and a third direction that are orthogonal to each other.

3. The method of claim 1, wherein:
    each atom of the plurality of atoms is one of a plurality of atomic species;
    said deriving includes deriving a plurality of species-aware directional order parameters for each atom; and
    said feeding comprises feeding, into the trained machine-learning model, the plurality of species-aware direction order parameters.

4. The method of claim 3, wherein said constructing includes constructing each of the plurality of crystal graphs up to an order n.

5. The method of claim 3,
    further comprising, for each species of the plurality of atomic species, calculating statistics of the plurality of species-aware directional order parameters derived from the plurality of atoms of said each species;
    wherein said feeding includes feeding the statistics into the trained machine-learning model.

6. The method of claim 5, wherein said calculating statistics includes calculating one or more of a mean, a mean absolute deviation, a minimum, and a maximum.

7. The method of claim 3, wherein a number of the plurality of atomic species is greater than or equal to two.

8. The method of claim 1, wherein each of the plurality of atoms is one of a first atomic species and a second atomic species different from the first atomic species.

9. The method of claim 8, wherein said feeding includes feeding, into the trained machine-learning model, a difference between a first electronegativity of the first atomic species and a second electronegativity of the second atomic species.

10. The method of claim 8, wherein said feeding the one or more global structural features includes feeding, into the trained machine-learning model:
    one or both of a first concentration of the first atomic species and a second concentration of the second atomic species; and
    lattice constants of the crystalline structure.

11. The method of claim 1, wherein the crystalline structure is one or more of: a random alloy, a superlattice, a random multilayer, and a non-ideal heterogeneous structure.

12. The method of claim 1, wherein the trained machine-learning model was trained with a plurality of fixed-size training units having an identical number of atoms.

13. The method of claim 12, the plurality of fixed-size training units including disordered units, ordered units, or a combination thereof.

14. The method of claim 1, the trained machine-learning model comprising a neural network or a random forest.

15. The method of claim 1,
    further comprising calculating, based on the plurality of energy values, one or more electronic transport properties of the crystalline structure;
    wherein said fabricating comprises fabricating the sample based on the one or more electronic transport properties.

16. The method of claim 15, wherein:
    said calculating the electronic transport properties includes calculating one or more electronic velocity values of the crystalline structure; and
    said fabricating comprises fabricating the sample based on the one or more electronic velocity values.

* * * * *